(12) United States Patent
Ishikawa et al.

(10) Patent No.: US 11,843,876 B2
(45) Date of Patent: Dec. 12, 2023

(54) OPTICAL FILTER ARRAY, PHOTODETECTION DEVICE, AND PHOTODETECTION SYSTEM

(71) Applicant: Panasonic Intellectual Property Management Co., Ltd., Osaka (JP)

(72) Inventors: Atsushi Ishikawa, Osaka (JP); Yasuhisa Inada, Osaka (JP); Kazuya Hisada, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 301 days.

(21) Appl. No.: 17/395,927

(22) Filed: Aug. 6, 2021

(65) Prior Publication Data

US 2021/0377498 A1 Dec. 2, 2021

Related U.S. Application Data

(63) Continuation of application No. PCT/JP2020/041439, filed on Nov. 6, 2020.

(30) Foreign Application Priority Data

Jan. 16, 2020 (JP) ................. 2020-005094

(51) Int. Cl.
 *H04N 25/13* (2023.01)
 *G01J 3/26* (2006.01)
 *H01L 27/146* (2006.01)

(52) U.S. Cl.
 CPC .............. *H04N 25/136* (2023.01); *G01J 3/26* (2013.01); *H01L 27/14621* (2013.01); *H01L 27/14645* (2013.01)

(58) Field of Classification Search
 CPC ........ H04N 25/136; G01J 3/26; G01J 3/2823; G01J 2003/2806; G01J 2003/2813;
 (Continued)

(56) References Cited

U.S. PATENT DOCUMENTS

| 2008/0042782 A1 | 2/2008 | Wang et al. |
| 2015/0015692 A1* | 1/2015 | Smart ............... G01J 3/51 348/77 |

(Continued)

FOREIGN PATENT DOCUMENTS

JP 2016-100703 5/2016

OTHER PUBLICATIONS

International Search Report of PCT application No. PCT/JP2020/041439 dated Jan. 19, 2021.
(Continued)

*Primary Examiner* — Christopher K Peterson
(74) *Attorney, Agent, or Firm* — Rimon P.C.; Michael E. Fogarty

(57) ABSTRACT

An optical filter array is used in a photodetection device that generates image data separately for each of N (where N is an integer greater than or equal to 4) wavelength bands. The optical filter array includes a plurality of optical filters. The plurality of optical filters include plural types of optical filters differing in transmittance from each other in each of the N wavelength bands. Assuming that pi is an average of transmittances of the plurality of optical filters for light in an ith wavelength band (where i is an integer greater than or equal to 1 and less than or equal to N) of the N wavelength bands, a standard deviation of the average $\mu_i$ of the transmittances for the N wavelength bands is less than or equal to 0.13.

9 Claims, 23 Drawing Sheets

(58) Field of Classification Search
CPC ....... G01J 2003/2826; H01L 27/14621; H01L 27/14645; G02B 5/28; G02B 5/201; G02B 27/0012; G01N 21/31; G01N 21/01; G01N 21/255; G01N 2021/0112; G03B 11/00

See application file for complete search history.

(56) References Cited

U.S. PATENT DOCUMENTS

| | | |
|---|---|---|
| 2016/0138975 A1 | 5/2016 | Ando et al. |
| 2016/0148344 A1 | 5/2016 | Koga |
| 2017/0010160 A1 | 1/2017 | Rosen et al. |
| 2017/0276996 A1* | 9/2017 | Barbour .............. G02F 1/13473 |
| 2017/0309758 A1 | 10/2017 | Frey et al. |
| 2019/0049809 A1* | 2/2019 | Oyama .................. G02F 1/157 |

OTHER PUBLICATIONS

The EPC Office Action dated May 10, 2023 for the related European Patent Application No. 20914325.4.

* cited by examiner

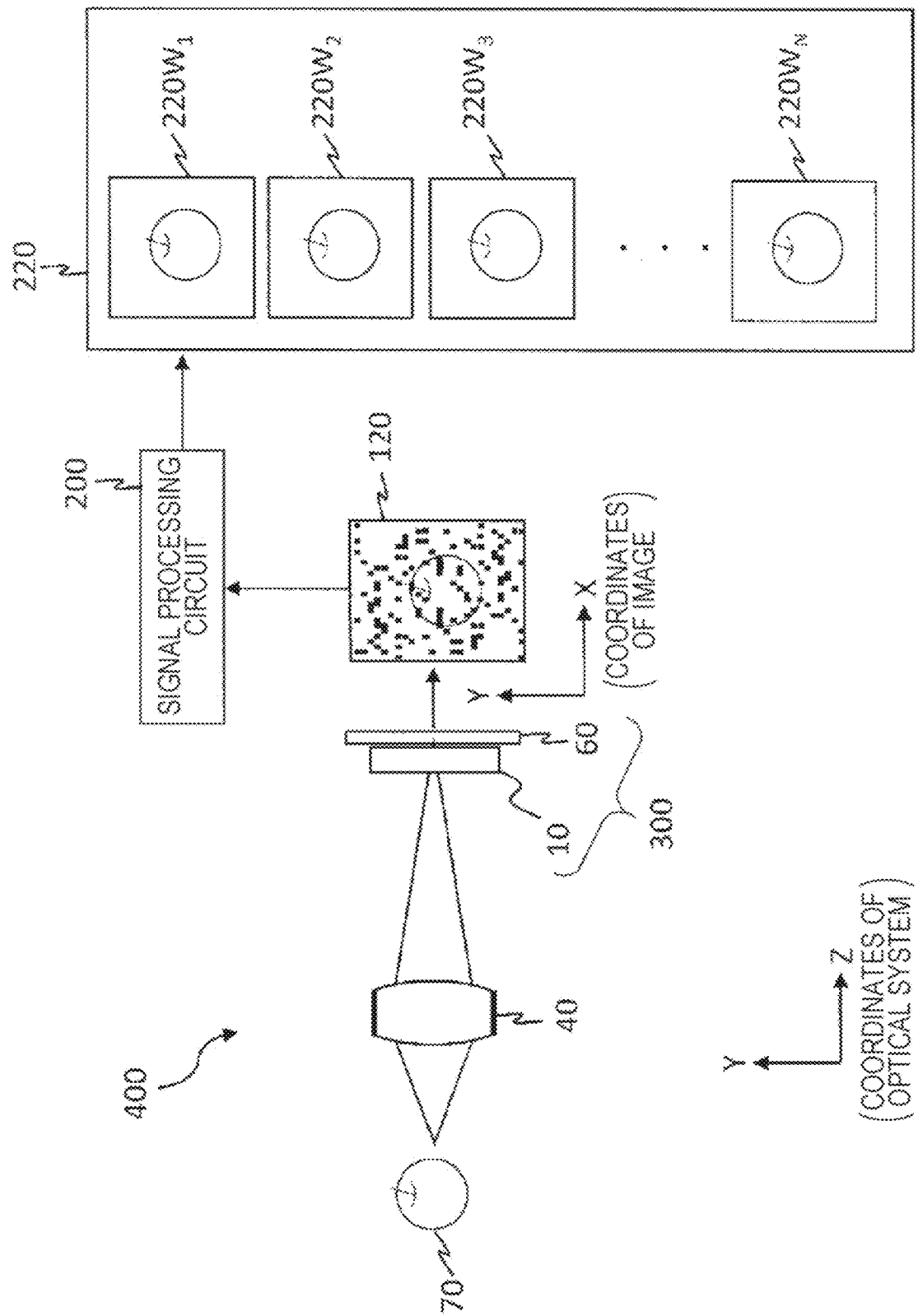

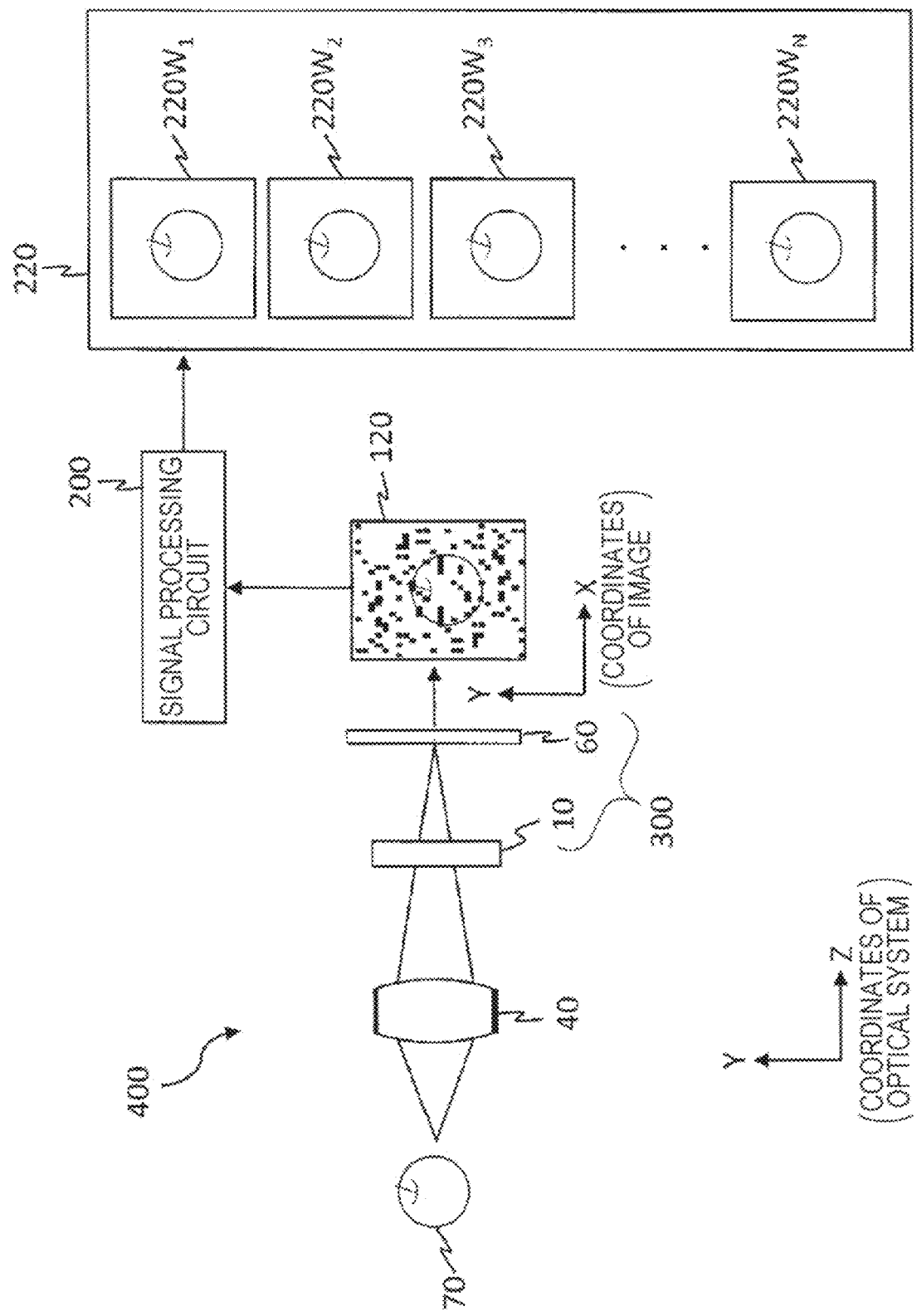

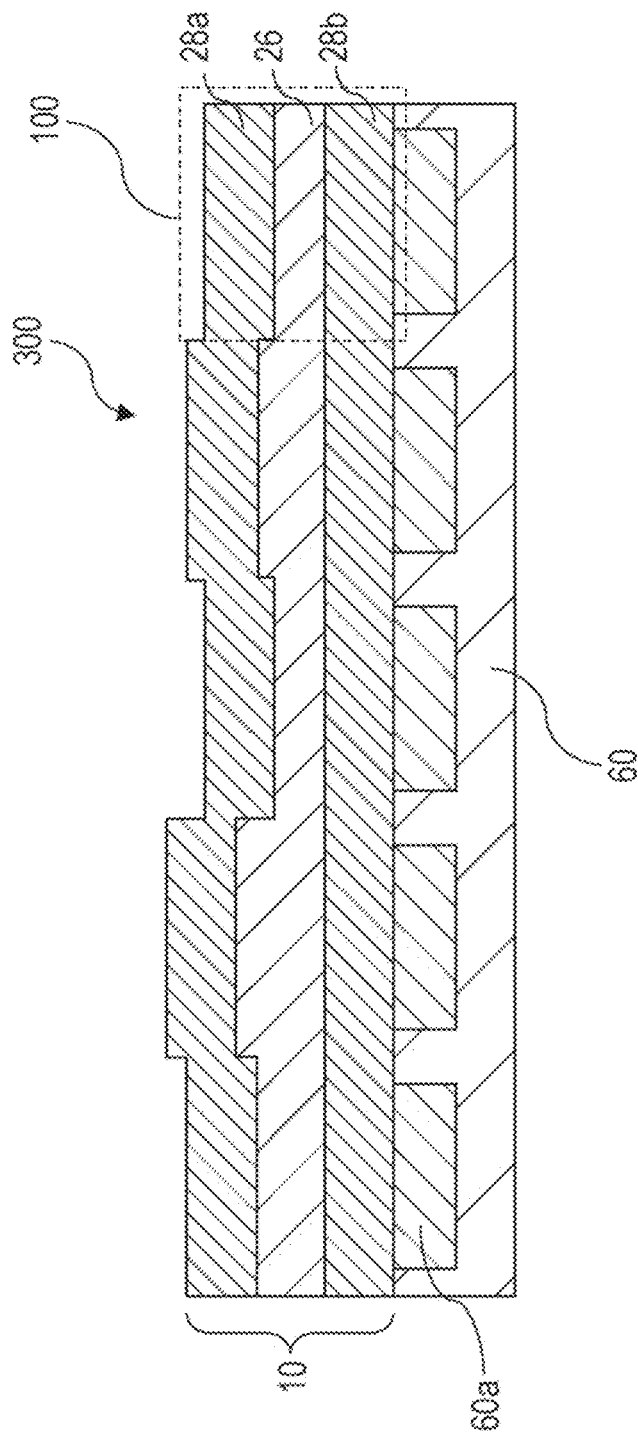

OPTICAL FILTER ARRAY, PHOTODETECTION DEVICE, AND PHOTODETECTION SYSTEM

BACKGROUND

1. Technical Field

The present disclosure relates to an optical filter array, a photodetection device, and a photodetection system.

2. Description of the Related Art

Utilization of spectral information on a large number of bands, e.g. several tens of bands, each of which is a narrow band makes it possible to understand in detail the physical properties of a physical object, although doing so has been impossible with a conventional RGB image. A camera that acquires such multiwavelength information is called "hyperspectral camera". Hyperspectral cameras have been utilized in various fields such as food inspection, biopsies, drug development, and componential analyses of minerals.

U.S. Patent Application Publication No. 2016/138975 and Japanese Unexamined Patent Application Publication No. 2016-100703 disclose hyperspectral cameras utilizing compressed sensing. For example, U.S. Patent Application Publication No. 2016/138975 discloses an imaging device including an encoding element that is an array of a plurality of optical filters differing in wavelength dependence of light transmittance from each other and an image sensor that detects light having passed through the encoding element. The image sensor acquires one multiple-wavelength image by simultaneously detecting light in a plurality of wavelength bands for each pixel. By applying compressed sensing to the multiple-wavelength image thus acquired, images are reconstructed separately for each of the plurality of wavelength bands.

SUMMARY

In one general aspect, the techniques disclosed here feature an optical filter array that is used in a photodetection device generating image data separately for each of N wavelength bands, N being an integer greater than or equal to 4. The optical filter array includes a plurality of optical filters. The plurality of optical filters include plural types of optical filters differing in transmittance from each other in each of the N wavelength bands. Assuming that $\mu_i$ is an average of transmittances of the plurality of optical filters for light in an ith wavelength band of the N wavelength bands, i being an integer greater than or equal to 1 and less than or equal to N, a standard deviation $\sigma_\mu$ of the average $\mu_i$ of the transmittances for the N wavelength bands is expressed as $$\sigma_\mu = \sqrt{\frac{1}{N}\sum_{i=1}^{N}(\mu_i - \mu_\mu)^2},$$

where $\mu_\mu = \frac{1}{N}\sum_{i=1}^{N}\mu_i,$ and the standard deviation $\sigma_\mu$ of the average $\mu_i$ of the transmittances is less than or equal to 0.13.

In another general aspect, the techniques disclosed here feature an optical filter array that is used in a photodetection device generating image data separately for each of N wavelength bands, N being an integer greater than or equal to 4. The optical filter array includes a plurality of optical filters. The plurality of optical filters include plural types of optical filters differing in transmittance from each other in each of the N wavelength bands. Assuming that $\sigma_i$ is a standard deviation of transmittances of the plurality of optical filters for light in an ith wavelength band of the N wavelength bands, i being an integer greater than or equal to 1 and less than or equal to N, an average of standard deviations $\sigma_i$ of the transmittances for the N wavelength bands is greater than or equal to 0.07.

In still another general aspect, the techniques disclosed here feature an optical filter array that is used in a photodetection device generating image data separately for each of N wavelength bands, N being an integer greater than or equal to 4. The optical filter array includes a plurality of optical filters. The plurality of optical filters include plural types of optical filters differing in transmittance from each other in each of the N wavelength bands. Assuming that $\mu_i$ is an average of transmittances of the plurality of optical filters for light in an ith wavelength band of the N wavelength bands, i being an integer greater than or equal to 1 and less than or equal to N, that $\sigma_i$ is a standard deviation of the transmittances of the plurality of optical filters for the light in the ith wavelength band, and that $R_i=(\mu_i+3\sigma_i)/(\mu_i-3\sigma_i)$, an average of $R_i$ for the N wavelength bands is greater than or equal to 2.0.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5A is a diagram schematically showing a photodetection system according to an exemplary embodiment of the present disclosure;

FIG. 5B is a diagram schematically showing a modification of the photodetection system according to the exemplary embodiment of the present disclosure;

FIG. 9 is a diagram schematically showing a part of a cross-section of a photodetection device according to the exemplary embodiment;

DETAILED DESCRIPTION

Prior to a description of an embodiment of the present disclosure, underlying knowledge found by the inventors is described.

In a hyperspectral camera utilizing compressed sensing, the quality of images to be reconstructed depends on the optical properties of an encoding element, i.e. an optical filter array. In a case where the characteristics of the optical filter array are not appropriate, there are great errors in images to be restored, with the result that high-quality reconstructed images cannot be obtained. Mathematically, an ideal optical filter array that performs spatially and spectrally (i.e. in frequency or wavelength space) random sampling is desirable. However, it is difficult to actually fabricate such an ideally random optical filter array. That is, there has been room for improvement in a specific configuration of an optical filter array capable of reducing errors entailed by reconstruction of images of a plurality of wavelength bands.

The following gives a brief overview of an embodiment of the present disclosure.

Figure 1A:
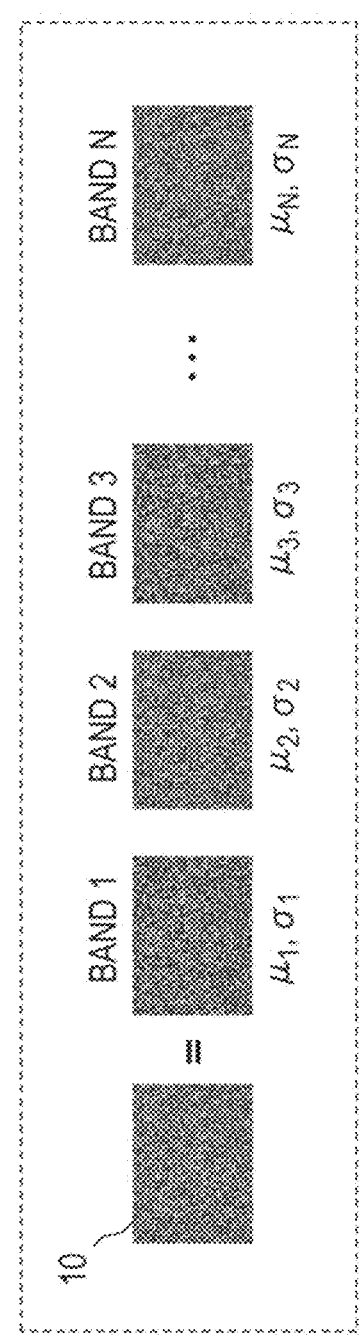
FIG. 1A is a diagram for explaining the optical characteristics of an optical filter array.

FIG. 1A is a diagram for explaining the optical characteristics of an optical filter array 10 according to the embodiment of the present disclosure. As shown in FIG. 1A, the filter array 10 includes a plurality of optical filters. The plurality of optical filters are arranged in a two-dimensional array. The plurality of optical filters include plural types of optical filter having different light transmission characteristics. The filter array 10 is used in a photodetection device that generates image data representing a plurality of wavelength bands, respectively. It is assumed that N (where N is an integer greater than or equal to 4) is the number of wavelength bands is. Distributions of light transmittances of the filter array 10 vary from wavelength band to wavelength band. In FIG. 1A, spatial patterns of light transmittance for each separate wavelength band are expressed as mosaic patterns.

Figure 1B:
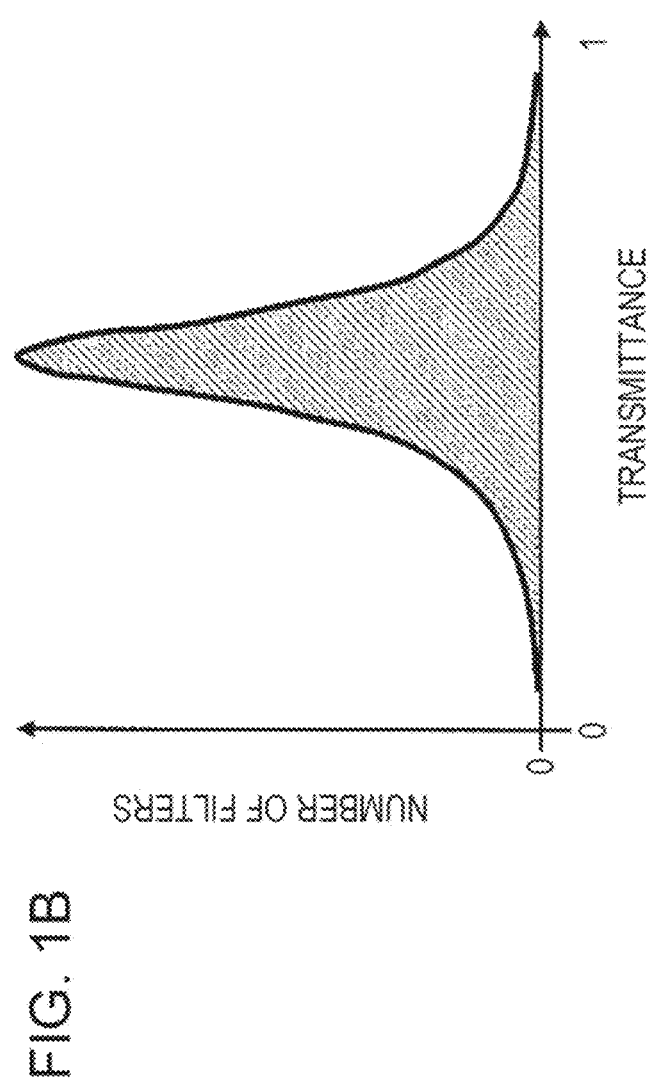
FIG. 1B is a diagram showing an example of a histogram of transmittance.

Thought is given here to a histogram of the transmittances of the plurality of optical filters of the filter array 10 for the ith (where i is an integer greater than or equal to 1 and less than or equal to N) wavelength band. FIG. 1B shows an example of a histogram of the transmittance of the filter array 10 according to the embodiment of the present disclosure. This histogram represents a distribution whose horizontal axis represents transmittance and whose vertical axis represents the number of filters having the transmittance. From this histogram, the average transmittance $\mu_i$ and the standard deviation $\sigma_i$ for light in the ith wavelength band are obtained. The histogram of the transmittance of the filter array 10 according to the embodiment of the present disclosure has a finite standard deviation $\sigma_i$.

The histogram can be obtained by measuring the transmittance of each of the optical filters of the filter array 10 with a photodetector that detects light intensity with a predetermined number of tones. For example, the histogram can be obtained by using a photodetector, such as an image sensor, that can detect a two-dimensional distribution of light intensity with a predetermined number of tones such as eight bits or sixteen bits. Specifically, the transmittance of light in the ith wavelength band of each of the filters of the filter array 10 can be calculated from the ratio of the intensity of light in the ith wavelength band as detected with the filter array 10 placed to the intensity of light in the ith wavelength band as detected with no filter array 10 placed. A histogram such as that illustrated in FIG. 1B can be obtained from data on the transmittance of each of the filters as acquired by the aforementioned method. For simplicity, FIG. 1B illustrates a histogram that is close to a normal distribution. In an actual filter array 10, a histogram differing in shape from that shown in FIG. 1B may be acquired. Since the wavelength dependence of transmittance varies from one filter to another, shapes of histograms vary from wavelength band to wavelength band. Accordingly, the average and standard deviation of the transmittances of the plurality of filters vary from wavelength band to wavelength band.

For example, each of the filters of the filter array 10 can be constituted using a multi-layer film, an organic material, a diffraction grating structure, or a metal-containing fine structure.

A case is described here as an example where each of the filters of the filter array 10 is constituted by a Fabry-Perot filter (hereinafter referred to as "FP filter"). The FP filter includes a first reflective layer, a second reflective layer, and an intermediate layer sandwiched between the first reflective layer and the second reflective layer. Each of the reflective layers may be formed from either a dielectric multi-layer film or a metal thin film. The intermediate layer has a thickness and a refractive index by which a resonant structure having at least one resonant mode is formed. The resonant structure is high in transmittance of light of a wavelength corresponding to the resonant mode and low in transmittance of light of another wavelength. Different transmission spectra can be achieved for each separate filter by varying the refractive index or thickness of the intermediate layer from one filter to another.

Figure 2:
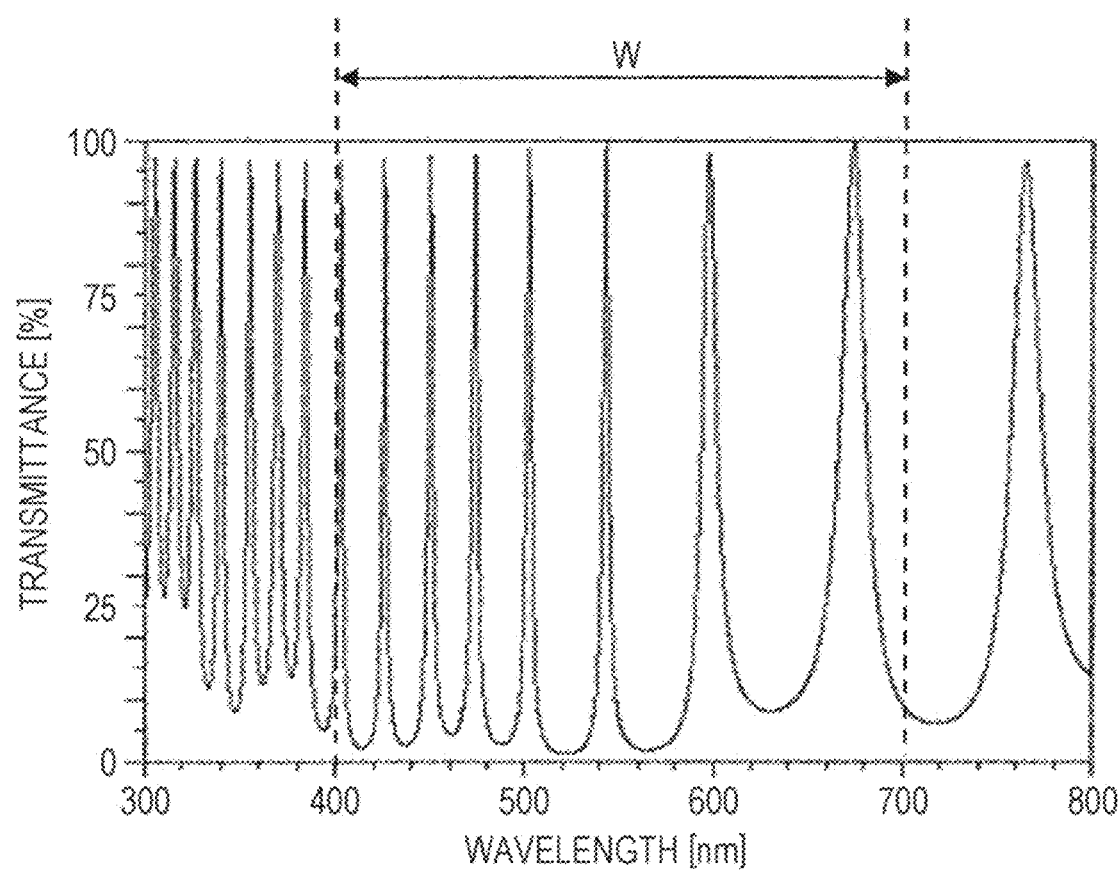
FIG. 2 is a diagram showing an example of the transmission spectrum of a Fabry-Perot filter.

FIG. 2 is a diagram showing an example of the transmission spectrum of the FP filter. Note here that the wavelength region to be detected is referred to as "target wavelength region W". The aforementioned first to Nth wavelength bands fall within the target wavelength region W. Although, in the example shown in FIG. 2, the target wavelength region W is a wavelength region ranging from 400 nm to 700 nm, the target wavelength region W may be another wavelength region. As shown in FIG. 2, in principle, the FP filter is thick (i.e. broad) in peak line width on the long-wavelength side and wider in spacing between peaks (free spectral range: FSR). For that reason, the transmission characteristics of the filter array 10 vary greatly between the short-wavelength side and the long-wavelength side. It was found that due to this difference in transmission characteristic, there is a great error in an image for each wavelength band that is generated.

Figure 3A:
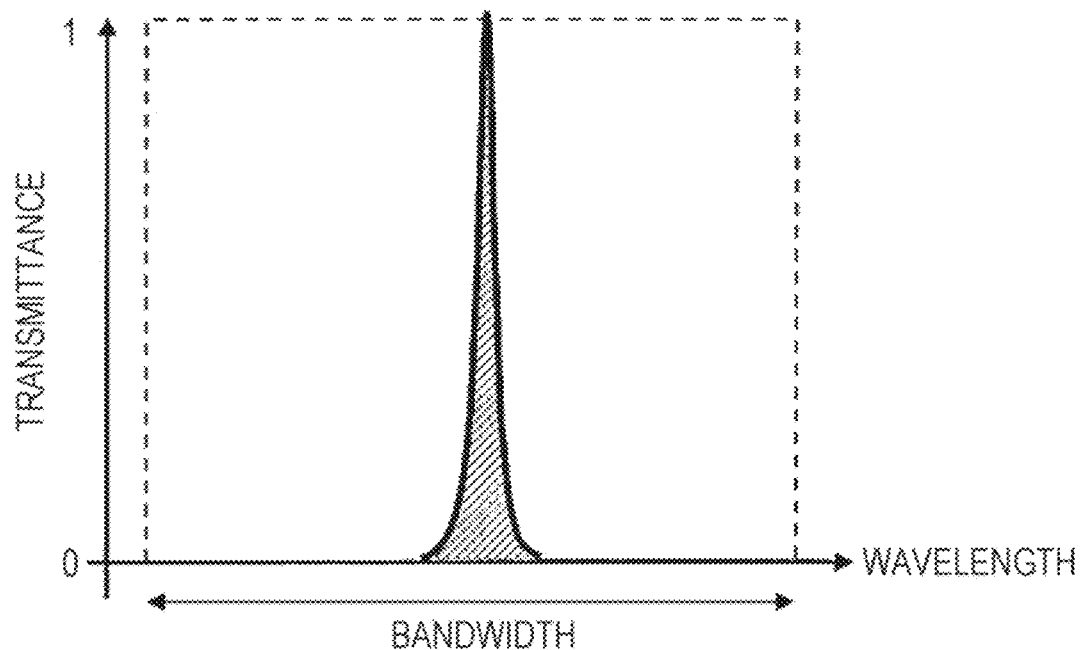
FIG. 3A is a first diagram for explaining a change in the average transmittance of the filter array for each wavelength band according to a magnitude relationship between a peak line width and a bandwidth.
Figure 3B:
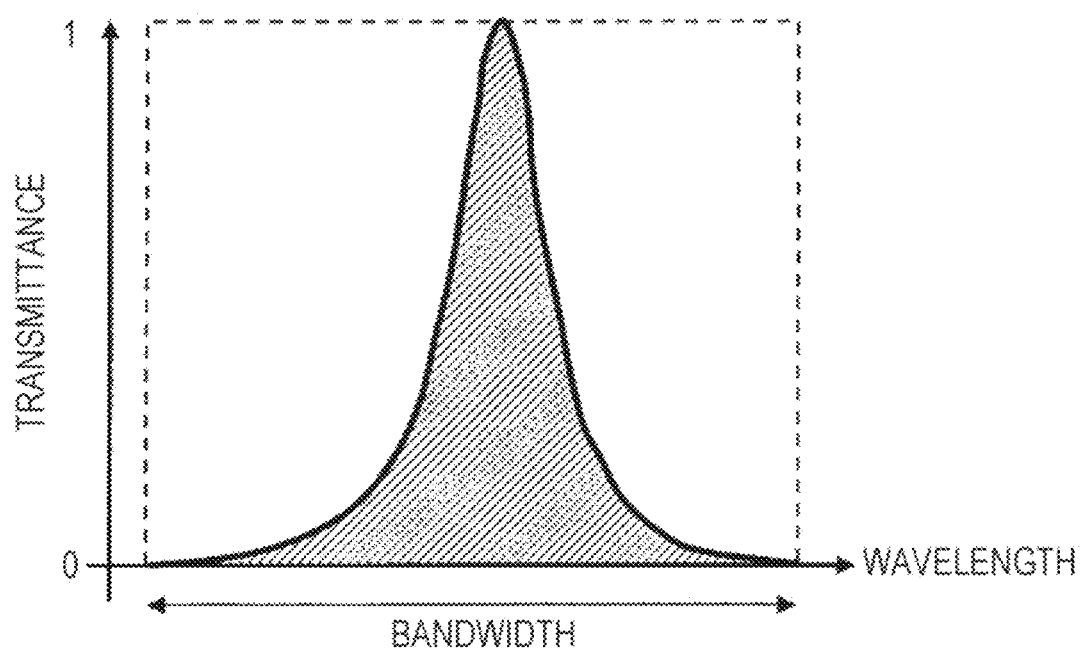
FIG. 3B is a second diagram for explaining a change in the average transmittance of the filter array for each wavelength band according to a magnitude relationship between a peak line width and a bandwidth.

FIGS. 3A and 3B are each a diagram for explaining a change in the average transmittance of the filter array 10 for each wavelength band according to a magnitude relationship between a peak line width and a bandwidth. Attention is focused here on a particular one of a plurality of transmission peaks. As shown in FIG. 3A, in a case where the peak line width is smaller than the bandwidth, the area of the peak within the band is small, so that the average transmittance in the band is low. On the other hand, as shown in FIG. 3B, in a case where the peak line width is thick, the average transmittance in the band is high. Because of the nature of the FP filter, the average transmittance is high on the long-wavelength side for the thick peak line width, and the transmittance is low on the short-wavelength side for the thin peak line width. For this reason, it is difficult to make the average transmittance uniform across the target wavelength region W, and there tend to be variations in the average transmittance from band to band. For this reason, it is difficult to achieve a spatially and spectrally (i.e. in frequency or wavelength space) random ideal filter array 10.

Figure 4A:
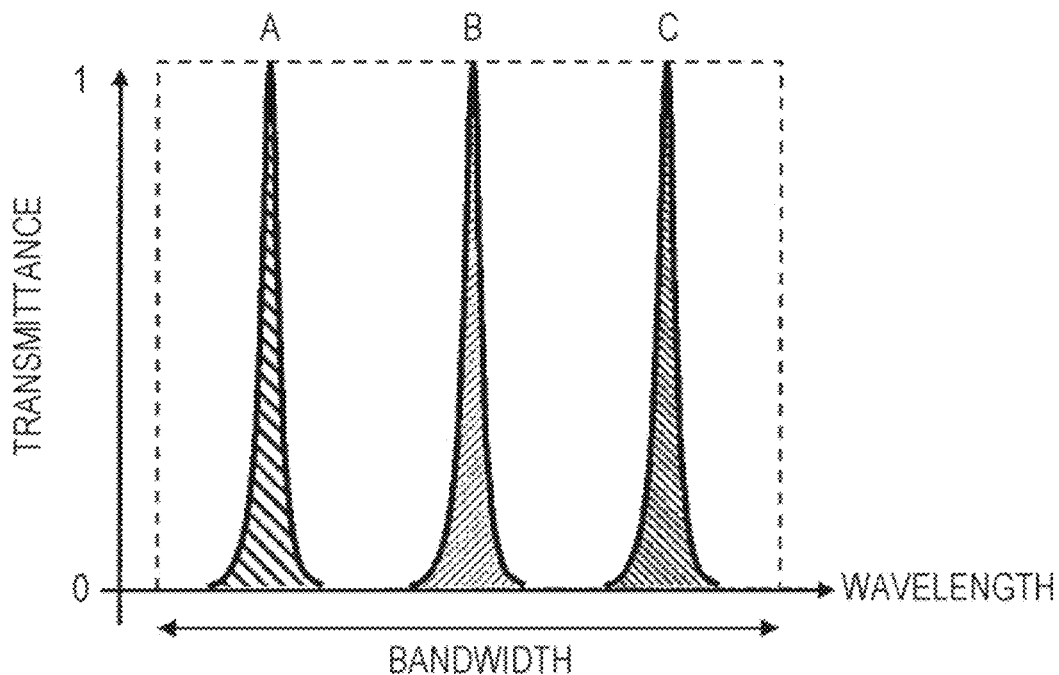
FIG. 4A is a first diagram for explaining a change in the standard deviation of the transmittance of the filter array for each wavelength band according to a magnitude relationship between a peak line width and a bandwidth.
Figure 4B:
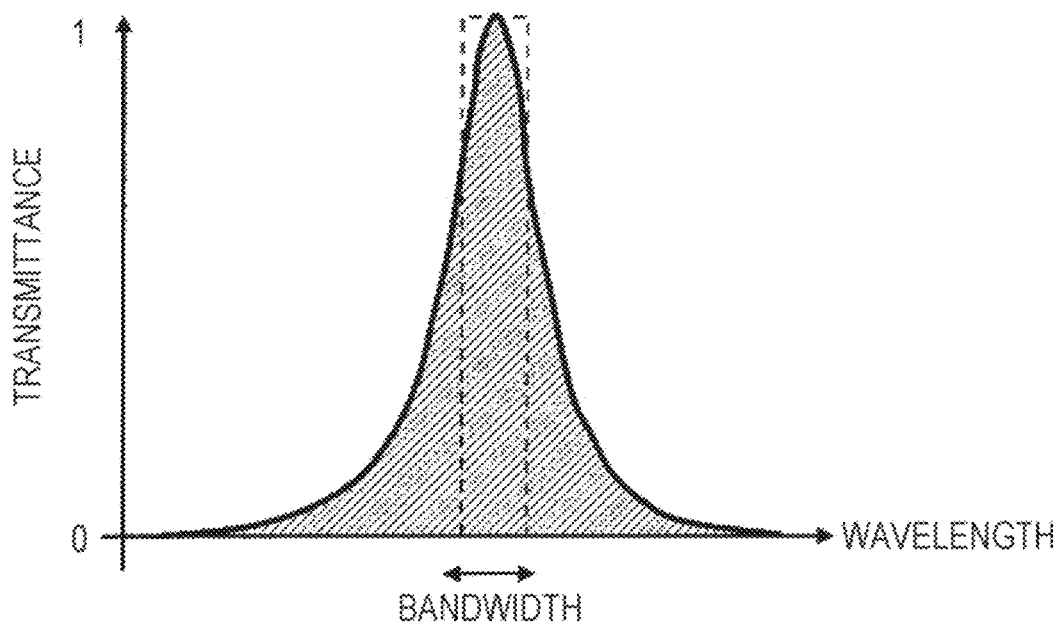
FIG. 4B is a second diagram for explaining a change in the standard deviation of the transmittance of the filter array for each wavelength band according to a magnitude relationship between a peak line width and a bandwidth.

FIGS. 4A and 4B are each a diagram for explaining a change in the standard deviation of the transmittance of the filter array 10 for each wavelength band according to a magnitude relationship between a peak line width and a bandwidth. As shown in FIG. 4A, in a case where the peak line width is sufficiently smaller than the bandwidth, the transmittances for light in the band of the plurality of different types of filter (in the example shown in FIGS. 4A, A, B, and C) included in the filter array 10 are about equal. For this reason, the standard deviation of the transmittance of the filter array 10 for the band is small. On the other hand, as shown in FIG. 4B, in a case where the peak line width is larger than the bandwidth, the transmittance 1 is close to 1, so that the transmittances of the plurality of different types of filter for the band are about equal. In this case, too, the standard deviation of the transmittance of the filter array 10 for the band is small. Accordingly, because of the nature of the FP filter, the standard deviation of the transmittance of the filter array 10 is small on the long-wavelength side and the short-wavelength side. For this reason, it is difficult to make the standard deviation of transmittance uniform across the target wavelength region W, and there tend to be variations in the standard deviation of transmittance from band to band. From this perspective, too, it is difficult to achieve a spatially and spectrally (i.e. in frequency or wavelength space) random ideal filter array 10.

According to the study conducted by the inventors, great variations in the average and standard deviation of the transmittance of a filter array lead to a decrease in reproducibility of images and a deterioration in convergence of restoring operations. Further, it was found that there is also a decrease in reproducibility of images in a case where the average of standard deviations of transmittance for each band is too small.

The inventors found the foregoing problems and studied a configuration of a filter array for solving these problems. According to an embodiment of the present disclosure, a filter array is designed so that the standard deviation (or variance) of the average transmittance in all bands is greater than or equal to a particular value. According to another embodiment, a filter array is designed so that the average of standard deviations of transmittance for each band is greater than or equal to a particular value. Such a design makes it possible to reduce restoration errors in images for each band.

An optical filter array according to an embodiment of the present disclosure is used in a photodetection device that generates image data separately for each of N (where N is an integer greater than or equal to 4) wavelength bands. The optical filter array includes a plurality of optical filters. The plurality of optical filters include plural types of optical filters differing in transmittance from each other in each of the N wavelength bands. Assuming that $\mu_i$ is an average of transmittances of the plurality of optical filters for light in an ith wavelength band (where i is an integer greater than or equal to 1 and less than or equal to N) of the N wavelength bands, a standard deviation $\sigma_\mu$ of the average p of the transmittances for the N wavelength bands is expressed as $$\sigma_\mu = \sqrt{\frac{1}{N}\sum_{i=1}^{N}(\mu_i - \mu_\mu)^2},$$

$$\text{where } \mu_\mu = \frac{1}{N}\sum_{i=1}^{N}\mu_i,$$

and the standard deviation $\sigma_\mu$ of the average $\mu_i$ of the transmittances is less than or equal to 0.13.

According to the foregoing configuration, each of the optical filters is designed so that the standard deviation $\sigma_\mu$ of the average $\mu_i$ of the transmittances for the N wavelength bands takes on a comparatively small value less than or equal to 0.13. This makes it possible to enhance the uniformity of the average transmittance of the optical filter array for each wavelength band. This can result in reduced errors in images in each separate wavelength band that are generated, for example, by a process that involves the use of compressed sensing.

An optical filter array according to another embodiment of the present disclosure is used in a photodetection device that generates image data separately for each of N (where N is an integer greater than or equal to 4) wavelength bands. The optical filter array includes a plurality of optical filters. The plurality of optical filters include plural types of optical filters differing in transmittance from each other in each of the N wavelength bands. Assuming that $\sigma_i$ is a standard deviation of transmittances of the plurality of optical filters for light in an ith wavelength band (where i is an integer greater than or equal to 1 and less than or equal to N) of the N wavelength bands, an average of standard deviations $\sigma_i$ of the transmittances for the N wavelength bands is greater than or equal to 0.07.

According to the foregoing configuration, each of the optical filters is designed so that the average of the standard deviations $\sigma_i$ of the transmittances for the N wavelength bands takes on a comparatively large value greater than or equal to 0.07. This makes it possible to improve the dispersibility of the transmittance of the optical filter array for each wavelength band. This can result in reduced errors in images in each separate wavelength band that are generated, for example, by a process that involves the use of compressed sensing.

An optical filter array according to still another aspect of the present disclosure is used in a photodetection device that generates image data separately for each of N (where N is an integer greater than or equal to 4) wavelength bands. The optical filter array includes a plurality of optical filters. The plurality of optical filters include plural types of optical filters differing in transmittance from each other in each of the N wavelength bands. Assuming that $\mu_i$ is an average of transmittances of the plurality of optical filters for light in an ith wavelength band (where i is an integer greater than or equal to 1 and less than or equal to N) of the N wavelength bands, that $\sigma_i$ is a standard deviation of the transmittances of the plurality of optical filters for the light in the ith wavelength band, and that $R_i=(\mu_i+3\sigma_i)/(\mu_i-3\sigma_i)$, an average of $R_i$ for the N wavelength bands is greater than or equal to 2.0.

According to the foregoing configuration, each of the optical filters is designed so that the average of $R_i$ takes on a comparatively large value greater than or equal to 2.0. This makes it possible to improve the dispersibility of the transmittance of the optical filter array for each wavelength band. This can result in reduced errors in images in each separate wavelength band that are generated, for example, by a process that involves the use of compressed sensing.

In an embodiment, a transmittance of a peak in a histogram of the transmittances as obtained by measuring a transmittance of each of the plurality of optical filters for the light in the ith wavelength band with a photodetector that detects light intensity with a predetermined number of tones may be smaller than the average $\mu_i$ of the transmittances of the plurality of optical filters for the light in the ith wavelength band.

At least one of the plurality of optical filters may be a Fabry-Perot filter. The Fabry-Perot filter can be fabricated more easily than another type of filter formed, for example, from an organic material.

At least one of the plurality of filters may include a first reflective layer, a second reflective layer, and an intermediate layer between the first reflective layer and the second reflective layer and may include a resonant structure having a plurality of resonant modes differing in order from each other. Such a structure makes it possible to achieve a filter with a high transmittance for a plurality of wavelengths.

A center wavelength $\lambda_i$ in the ith wavelength band and the average $\mu_i$ of the transmittances of the plurality of optical filters for the light in the ith wavelength band may have a positive correlation. In a case where each optical filter is the aforementioned Fabry-Perot filter, such a characteristic can be typically obtained.

A photodetection device according to still another embodiment of the present disclosure includes the optical filter array according to any of the above and an image sensor that detects light having passed through the optical filter array.

A photodetection system according to still another embodiment of the present disclosure includes the photodetection device and a signal processing circuit that generates image data for each of the N wavelength bands in accordance with a signal outputted from the image sensor.

In the present disclosure, all or some of the circuits, units, devices, members, or sections or all or some of the functional blocks in the block diagrams may be implemented as one or more of electronic circuits including, but not limited to, a semiconductor device, a semiconductor integrated circuit (IC), or an LSI (large scale integration). The LSI or IC can be integrated into one chip, or also can be a combination of multiple chips. For example, functional blocks other than a memory may be integrated into one chip. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or some of the functions or operations of the circuits, units, devices, members, or sections are implemented by executing software. In such a case, the software is recorded on one or more non-transitory recording media such as a ROM, an optical disk, or a hard disk drive, and when the software is executed by a processor, the software causes the processor together with peripheral devices to execute the functions specified in the software. A system or device may include such one or more non-transitory recording media on which the software is recorded and a processor together with necessary hardware devices such as an interface.

The following describes a more specific embodiment of the present disclosure. Note, however, that an unnecessarily detailed description may be omitted. For example, a detailed description of a matter that is already well known and a repeated description of substantially identical configurations may be omitted. This is intended to avoid unnecessary redundancy of the following description and facilitate understanding of persons skilled in the art. It should be noted that the inventors provide the accompanying drawings and the following description for persons skilled in the art to fully understand the present disclosure and do not intend to thereby limit the subject matter recited in the claims. In the following description, identical or similar constituent elements are given the same reference signs. A signal representing an image (i.e. a set of signals representing the pixel values of each separate pixel) is herein sometimes simply referred to as "image". The following description involves the use of an xyz coordinate shown in the drawings.

Embodiment

Photodetection System

FIG. 5A is a diagram schematically showing a photodetection system 400 according to an exemplary embodiment of the present disclosure. The photodetection system 400 includes an optical system 40, a filter array 10, an image sensor 60, and a signal processing circuit 200. The filter array 10 has a function which is similar to that of the "encoding element" disclosed in U.S. Patent Application Publication No. 2016/138975. For this reason, the filter array 10 may also be referred to as "encoding element". The optical system 40 and the filter array 10 are disposed on the optical path of incident light from a physical object 70.

The filter array 10 includes a plurality of translucent areas arranged in rows and columns. The filter array 10 is an optical element in which the transmission spectrum of light, i.e. the wavelength dependence of light transmittance, varies from one area to another. The filter array 10 allows passage of the incident light by modulating the intensity of the incident light. A configuration of the filter array 10 will be described in detail later.

The filter array 10 may be disposed near or directly above the image sensor 60. The term "near" here means that the filter array 10 is so close to the image sensor 60 that an image of light from the optical system 40 is formed on a surface of the filter array 10 with a certain degree of definition. The term "directly above" here means that the filter array 10 is so close to the image sensor 60 that almost no gap is formed between them. The filter array 10 and the image sensor 60 may be integrated. A device including the filter array 10 and the image sensor 60 is referred to as "photodetection device 300".

Figure 5C:
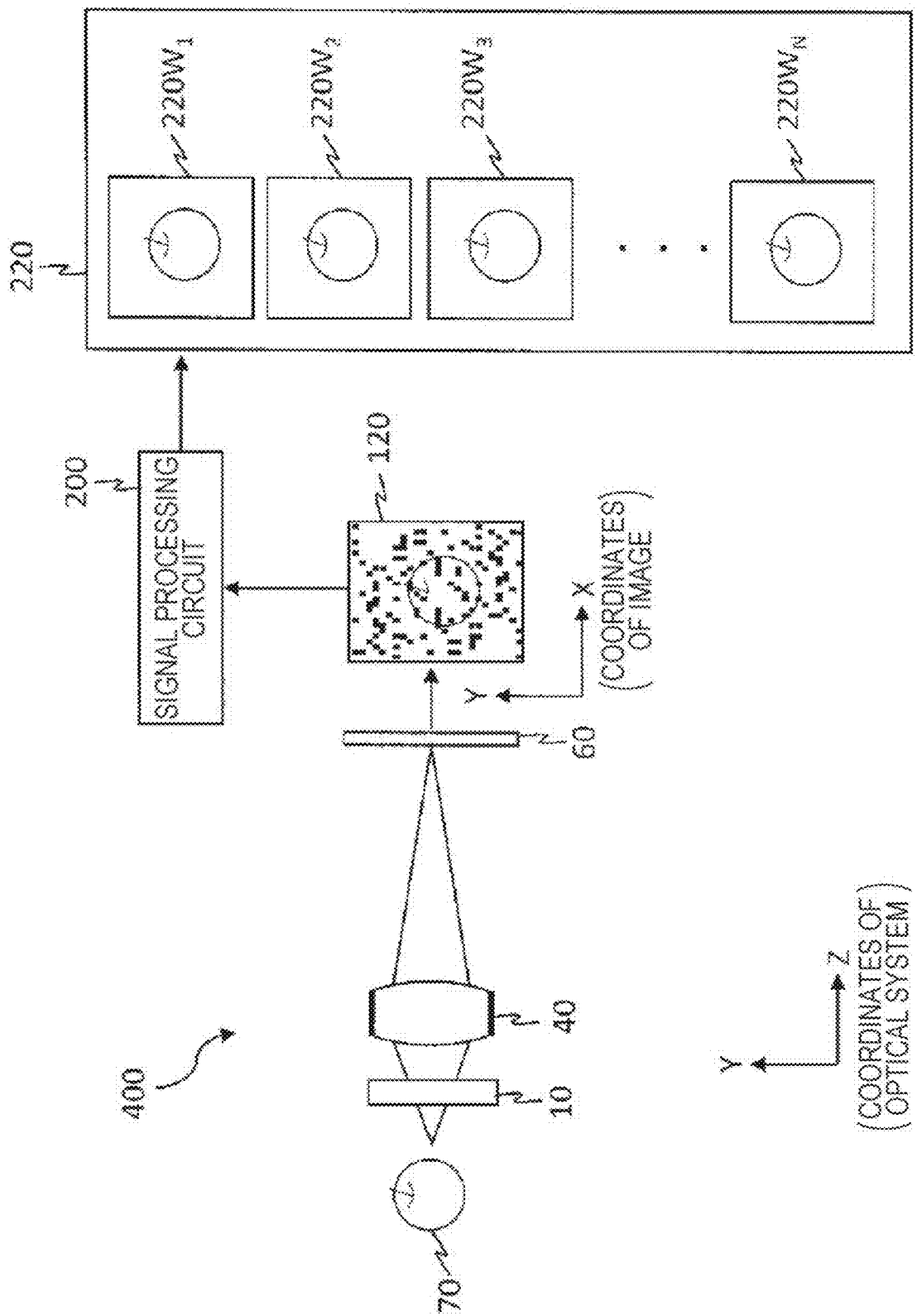
FIG. 5C is a diagram schematically showing another modification of the photodetection system according to the exemplary embodiment of the present disclosure.

The filter array 10 may be placed at a distance from the image sensor 60. FIGS. 5B and 5C show examples of configurations in which the filter array 10 is placed at a distance from the image sensor 60. In the example shown in FIG. 5B, the filter array 10 is disposed between the optical system 40 and the image sensor 60. In the example shown in FIG. 5C, the filter array 10 is disposed between the physical object 70 and the optical system 40. In these examples, an image encoded by the filter array 10 is acquired in a blurred state on an imaging surface of the image sensor 60. Accordingly, separate images 220 can be reconstructed by retaining this blur information in advance and reflecting the blur information in a system matrix H that is used in the after-mentioned arithmetic processing. Note here that the blur information is expressed by a point-spread function (PSF). The PSF is a function that defines the extent of spread of a point image to surrounding pixels. For example, in a case where a point image equivalent to one pixel on an image spreads to an area of k×k pixels around the pixel due to blurring, the PSF may be defined as a group of coefficients, i.e. a matrix, indicating effects on the luminance of each pixel within the area. Spectroscopic separate images can be reconstructed by reflecting, in the after-mentioned system matrix H, the effects of blurring of an encoding pattern by the PSF. Although the filter array 10 can be disposed in any place, such a place may be selected that the encoding pattern of the filter array 10 does not spread excessively into disappearance.

The optical system 40 includes at least one lens. Although FIG. 5A illustrates the optical system 40 as one lens, the optical system 40 may be constituted by a combination of a plurality of lenses. The optical system 40 forms an image on the imaging surface of the image sensor 60 via the filter array 10.

The image sensor 60 is a monochromatic photodetector having a plurality of photodetection elements (herein also referred to as "pixels") arranged in a two-dimensional array. The image sensor 60 may for example be a CCD (charge-coupled device), a CMOS (complementary metal oxide semiconductor), an infrared array sensor, a terahertz array sensor, or a millimeter wave array sensor. The photodetection elements include, for example, photodiodes. The image sensor 60 does not necessarily need to be a monochromatic sensor. The image sensor 60 may for example be a color sensor having a R/G/B, R/G/B/IR, or R/G/B/W filter. Using a color sensor makes it possible to increase the amount of information regarding wavelengths and improve the accuracy of reconstruction of spectroscopic separate images. However, since the use of a color sensor leads to a decrease in the amount of information in spatial directions (x and y directions), there is a trade-off between the amount of information regarding wavelengths and resolution The range of wavelengths to be acquired may be arbitrarily determined, and may be a range of ultraviolet, near-infrared, mid-infrared, far-infrared, microwave, or microwave or radio wave wavelengths without being limited to a range of visible wavelengths.

On the basis of an image 120 acquired by the image sensor 60, the signal processing circuit 200 reconstructs a plurality of separate images $220W_1$, $220W_2$, $220W_3$, . . . , and $220W_N$ containing multiwavelength information. The plurality of separate images $220W_1$, $220W_2$, $220W_3$, . . . , and $220W_N$ and a method by which the signal processing circuit 200 processes an image signal will be described in detail later. The signal processing circuit 200 may be incorporated into the photodetection device 300, or may be a constituent element of a signal processing device electrically connected to the photodetection device 300 by wire or radio.

The following describes the filter array 10 according to the present embodiment. The filter array 10 is disposed on the optical path of incident light from the physical object 70, modulates the intensity of the incident light for each wavelength, and outputs the resulting light. This process, which is done by the filter array 10, is herein referred to as "encoding".

Figure 6A:
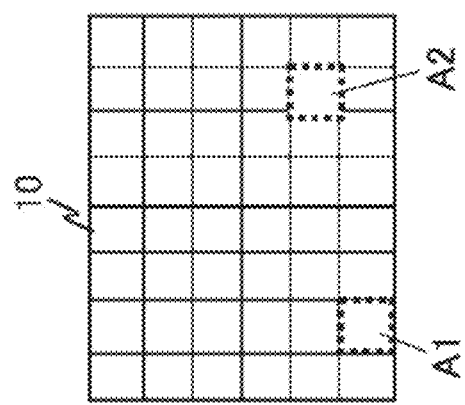
FIG. 6A is a diagram schematically showing an example of a filter array.

FIG. 6A is a diagram schematically showing an example of the filter array 10. The filter array 10 has a plurality of areas arranged in a two-dimensional array. These areas are herein sometimes referred to as "cells". In each of the areas, an optical filter having an individually set transmission spectrum is disposed. The transmission spectrum is expressed by a function $T(\lambda)$, where $\lambda$ is the wavelength of incident light. The transmission spectrum $T(\lambda)$ may assume a value greater than or equal to 0 and less than or equal to 1.

In the example shown in FIG. 6A, the filter array 10 has forty-eight rectangular areas arranged in six rows and eight columns. This is merely an example, and in an actual application, a larger number of areas may be provided. The number may be about equal to the number of pixels of a common photodetector such as an image sensor. The number of pixels range, for example, from hundreds of thousands to tens of millions. In the example shown in FIG. 5A, the filter array 10 may be disposed directly above the image sensor 60 so that each of the areas corresponds to one pixel of the photodetector. Each of the areas faces, for example, one pixel of the image sensor 60.

Figure 6B:
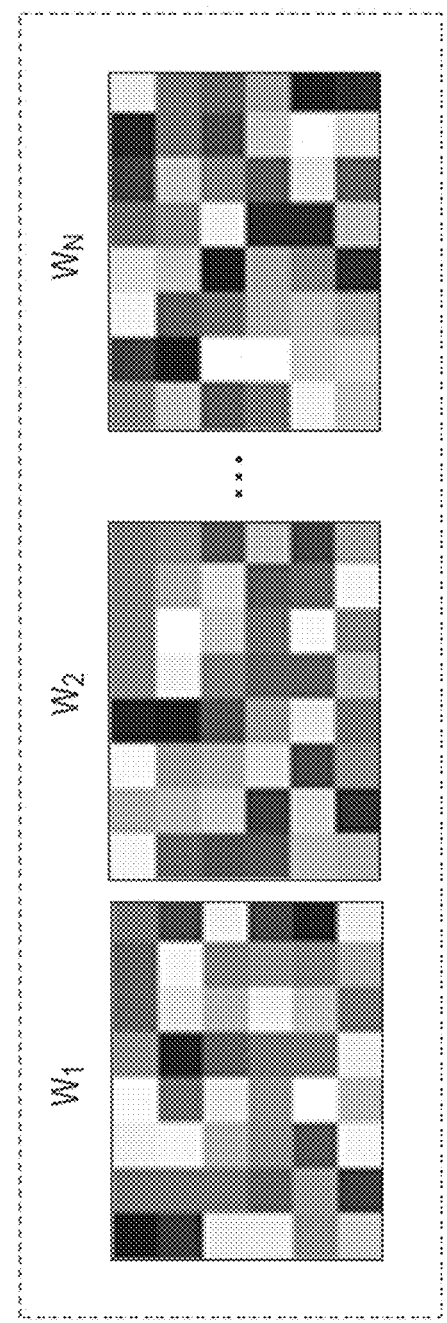
FIG. 6B is a diagram showing examples of spatial distributions of light transmittances of the filter array.

FIG. 6B is a diagram showing examples of spatial distributions of the transmittances of light separately in each of a plurality of wavelength bands $W_1, W_2, \ldots,$ and $W_N$ included in a target wavelength region. In the example shown in FIG. 6B, light and dark irregularities seen in the areas represent differences in transmittance. A lighter area is higher in transmittance, and a darker area is lower in transmittance. As shown in FIG. 6B, the spatial distributions of light transmittances vary from wavelength band to wavelength band.

Figure 6C:
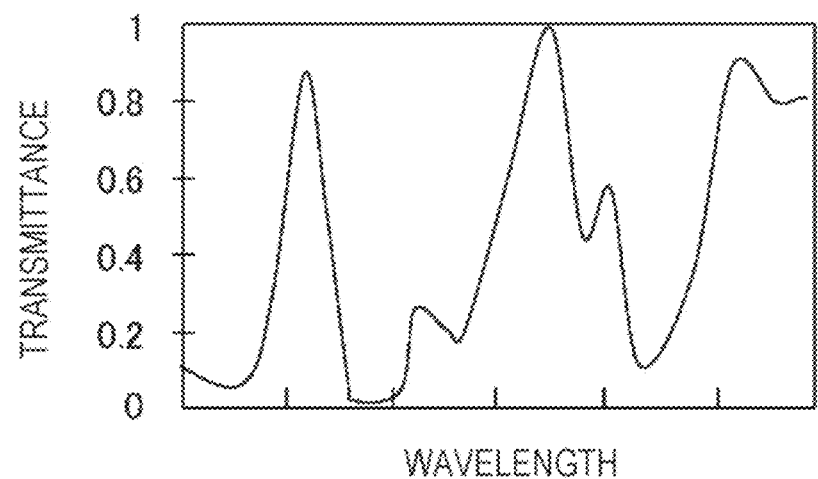
FIG. 6C is a diagram showing an example of the transmission spectrum of a filter.
Figure 6D:
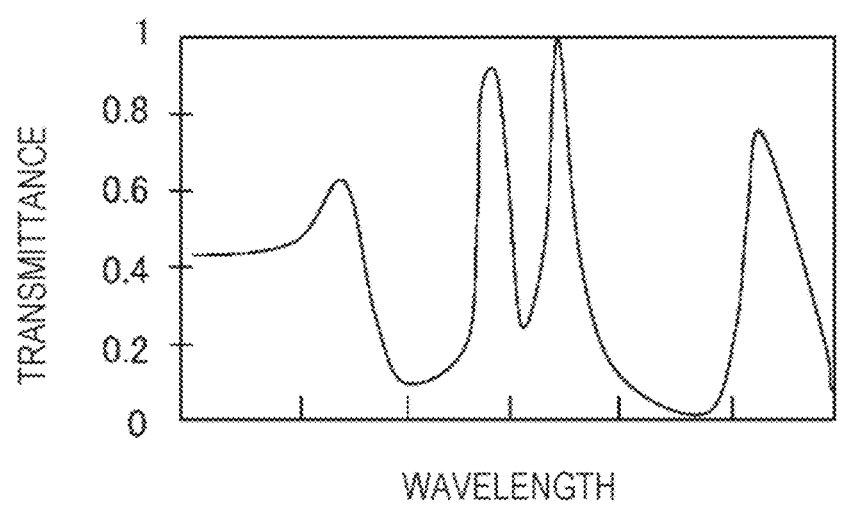
FIG. 6D is a diagram showing another example of the transmission spectrum of a filter.

FIGS. 6C and 6D are diagrams showing examples of the transmission spectra of areas A1 and A2, respectively, included in the plurality of areas of the filter array 10 shown in FIG. 6A. The transmission spectrum of the area A1 and the transmission spectrum of the area A2 are different from each other. In this way, the transmission spectrum of the filter array 10 varies from one area to another. Note, however, that not all areas need to have different transmission spectra. In the filter array 10, at least some of the plurality of areas have transmission spectra differing from each other. The filter array 10 includes two or more filters having transmission spectra differing from each other. In an example, the number of patterns of the transmission spectra of the plurality of areas of the filter array 10 may be equal to or larger than the number N of wavelength bands included in the target wavelength region. The filter array 10 may be designed so that more than half of the areas have different transmission spectra.

Figure 7A:
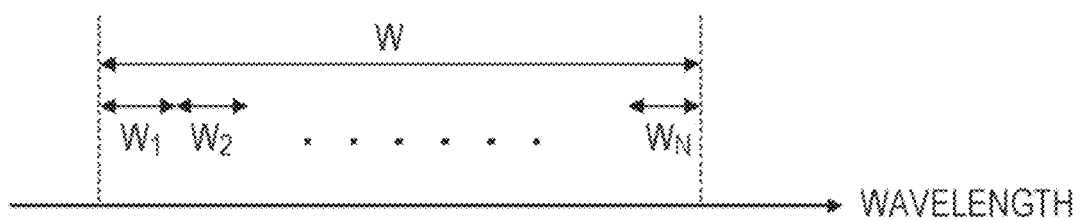
FIG. 7A is a diagram for explaining a relationship between a target wavelength region W and a plurality of wavelength bands $W_1, W_2, \ldots,$ and $W_N$ included in the target wavelength region W.
Figure 7B:
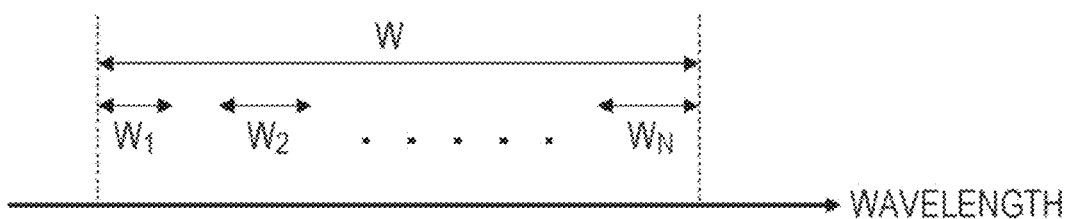
FIG. 7B is a diagram for explaining a relationship between a target wavelength region W and a plurality of wavelength bands $W_1, W_2, \ldots,$ and $W_N$ included in the target wavelength region W.

FIGS. 7A and 7B are diagrams for explaining a relationship between a target wavelength region W and a plurality of wavelength bands $W_1, W_2, \ldots,$ and $W_N$ included in the target wavelength region W. The target wavelength region W may be set to various ranges according to application. The target wavelength region W may for example be a wavelength region of visible light ranging from approximately 400 nm to approximately 700 nm, a wavelength region of near-infrared light ranging from approximately 700 nm to approximately 2500 nm, a wavelength region of near-ultraviolet light ranging from approximately 10 nm to approximately 400 nm, or a band of radio waves such as mid-infrared light, far-infrared light, terahertz waves, or millimeter waves. Thus, a wavelength region that is used is not limited to a visible light range. Invisible light such as near-ultraviolet light, near-infrared light, and radio waves, as well as visible light, is herein referred to as "light" for convenience.

In the example shown in FIG. 7A, N is an arbitrary integer greater than or equal to 4, and the target wavelength region W is divided into N equal wavelength bands $W_1, W_2, \ldots,$ and $W_N$. Note, however, that this example is not intended to impose any limitation. The plurality of wavelength bands included in the target wavelength region W may be arbitrarily set. For example, the wavelength bands may have non-uniform bandwidths. There may be a gap between adjacent wavelength bands. In the example shown in FIG. 7B, the wavelength bands have different bandwidths and there is a gap between two adjacent wavelength bands. Thus, the plurality of wavelength bands need only be different from one another, and how they are different can be determined arbitrarily. The number N of wavelength bands into which the target wavelength region W is divided may be smaller than or equal to 3.

Figure 8A:
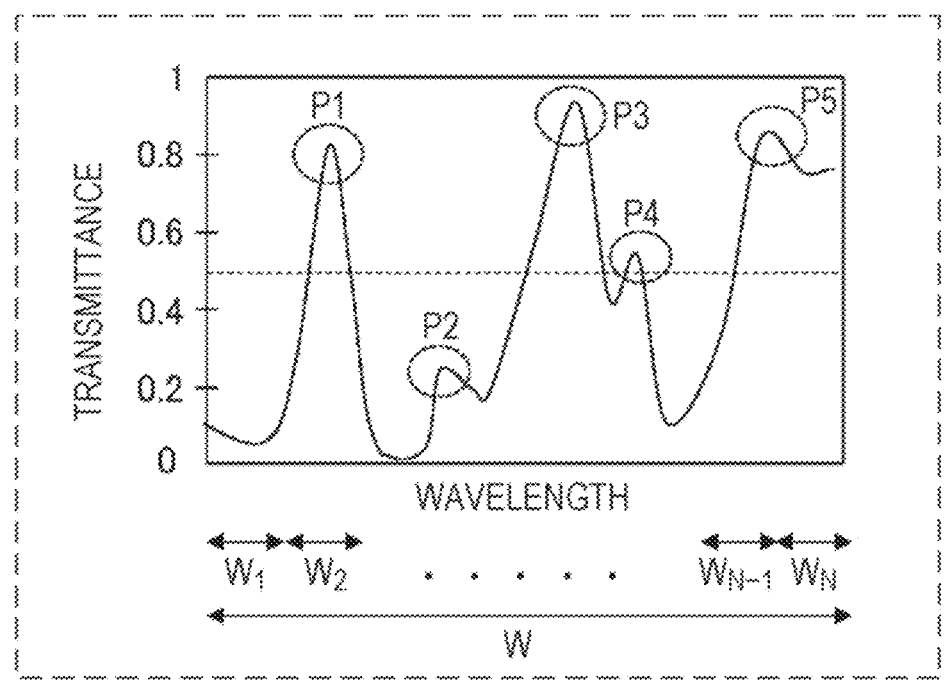
FIG. 8A is a diagram for explaining the characteristics of a transmission spectrum in a certain area of the filter array.

FIG. 8A is a diagram for explaining the characteristics of a transmission spectrum in a certain area of the filter array 10. In the example shown in FIG. 8A, the transmission spectrum has a plurality of local maximum values P1 to P5 and a plurality of local minimum values at wavelengths within the target wavelength region W. The example shown in FIG. 8A is normalized so that the largest and smallest values of light transmittance within the target wavelength region W are 1 and 0, respectively. In the example shown in FIG. 8A, the transmittance spectrum has local maximum values in wavelength regions such as the wavelength band $W_2$ and a wavelength band $W_{N-1}$. Thus, in the present embodiment, the transmission spectrum of each of the areas has local maximum values in at least two of the plurality of wavelength bands $W_1$ to $W_N$. As can be seen from FIG. 8A, the local maximum values P1, P3, P4, and P5 are greater than or equal to 0.5.

As noted above, the light transmittance of each of the areas varies from one wavelength to another. Accordingly, the filter array 10 transmits much of a component of the incident light lying within a certain wavelength region and does not transmit as much of a component of the incident light lying within another wavelength region. For example, the transmittance of light in k out of the N wavelength bands may be higher than 0.5, and the transmittance of light in the remaining N-k wavelength regions may be lower than 0.5. k is an integer that satisfies $2 \le k < N$. If the incident light is white light containing all wavelength components of visible light evenly, the filter array 10 modulates the incident light for each area into light having a plurality of wavelength-discrete peaks of intensity, and outputs these multiwavelength lights superimposed on each other.

Figure 8B:
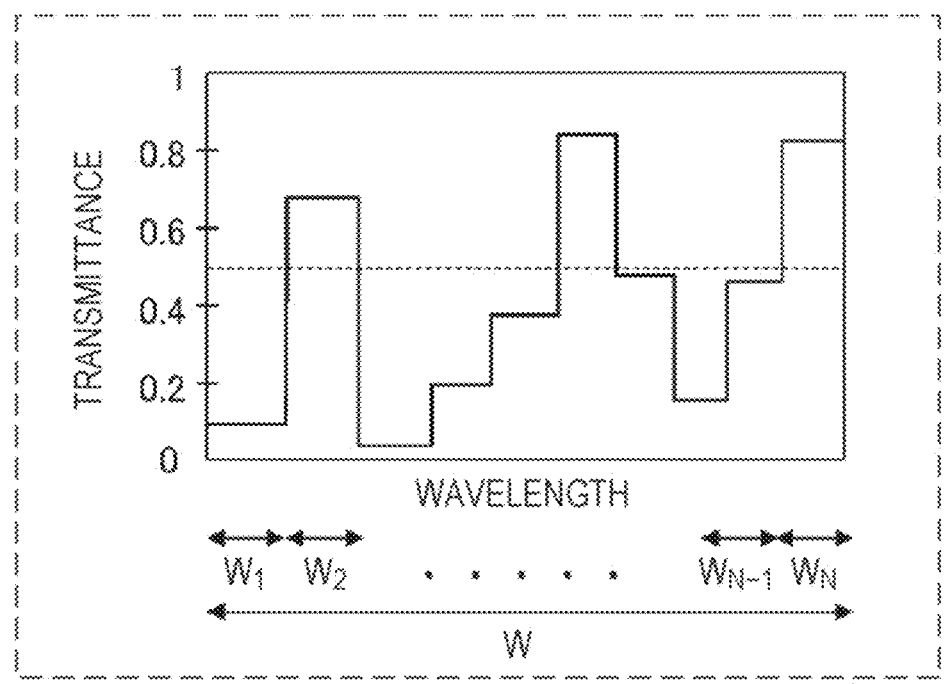
FIG. 8B is a diagram showing a result obtained by averaging, for each of the wavelength bands $W_1, W_2, \ldots,$ and $W_N$, the transmission spectrum shown in FIG. 8A.

FIG. 8B is a diagram showing a result obtained by averaging, for each of the wavelength bands $W_1, W_2, \ldots,$ and $W_N$, the transmission spectrum shown in FIG. 8A. The averaged transmittance can be obtained by integrating the transmission spectrum $T(\lambda)$ for each wavelength band and dividing the transmission spectrum $T(\lambda)$ by the bandwidth of that wavelength band. The value of transmittance thus averaged for each wavelength band is herein referred to as "transmittance in the wavelength band". In this example, prominently high transmittances are seen in three wavelength regions assuming the local maximum values P1, P3, and P5. In particular, transmittances exceeding 0.8 are seen in two wavelength regions assuming the local maximum values P3 and P5.

In a case where the filter array 10 is disposed near or directly above the photodetector, the plurality of areas of the filter array 10 may be placed at spacings, called cell pitches, that are substantially equal to pitches at which pixels of the photodetector are placed. In this way, the resolution of an encoded image of light emitted from the filter array 10 is substantially equal to the resolution of the pixels. The after-mentioned operation can be facilitated by allowing light having passed through a cell to fall on only one pixel. In a case where the filter array 10 is placed at a distance from the photodetector, the cell pitches may be made finer according to the distance.

The examples shown in FIGS. 6A to 6D assume gray-scale transmittance distributions in which the transmittance of each of the areas may assume any value greater than or equal to 0 and less than or equal to 1. However, the gray-scale transmittance distributions are not always the case. For example, it is possible to employ binary-scale transmittance distributions in which the transmittance of each of the areas may assume a value of either substantially 0 or substantially 1. In the binary-scale transmittance distributions, each of the areas transmits a large portion of light in at least two of the plurality of wavelength regions included in the target wavelength region and does not transmit a large portion of light in the remaining wavelength regions. The term "large portion" here refers to substantially 80% or larger.

Some of all cells, e.g. half of the cells, may be replaced by transparent areas. Such a transparent area transmits, at about equally high transmittances, e.g. at a transmittances higher than or equal to 80%, light in all of the wavelength regions $W_1$ to $W_N$ included in the target wavelength region. In such a configuration, the plurality of transparent areas may be arranged, for example, in a checkered pattern. That is, in two array directions of the plurality of areas of the filter array 10, the areas whose light transmittances vary according to wavelength and the transparent areas may be alternately arrayed.

Example of Signal Processing

The following describes an example of a process that is performed by the signal processing circuit 200. The signal processing circuit 200 reconstructs the multiwavelength separate images 220 on the basis of the image 120 outputted from the image sensor 60 and the spatial distribution characteristics of transmittance of the filter array 10 for each wavelength. The term "multiwavelength" here means a larger number of wavelength regions than the number of wavelength regions of three colors of RGB acquired, for example, by an ordinary color camera. This number of wavelength regions may be a number ranging, for example, approximately from 4 to 100. This number of wavelength regions is referred to as "number of bands". In some applications, the number of bands may exceed 100.

Desired data is the separate images 220, and the data is denoted by f. When the number of spectral bands is denoted by N, f is data obtained by integrating image data $f_1$, $f_2$, . . . , and $f_N$ of each separate band. When the number of pixels in an x direction of the image data to be obtained is denoted by n and the number of pixels in a y direction is denoted by m, each of the image data $f_1$, $f_2$, . . . , and $f_N$ is a set of two-dimensional data representing n×m pixels. Accordingly, the data f is three-dimensional data representing the number of elements n×m×N. Meanwhile, the number of elements of data g representing the image 120 acquired though encoding and multiplexing by the filter array 10 is n×m. In the present embodiment, the data g can be expressed by Formula (1) as follows:

$$g = Hf = H \begin{bmatrix} f_1 \\ f_2 \\ \vdots \\ f_N \end{bmatrix} \quad (1)$$

In this formula, $f_1$, $f_2$, . . . , and $f_N$ are data having n×m elements. Accordingly, the right-hand vector is technically a one-dimensional vector with an n×m×N rows and one column. The vector g is expressed and calculated in terms of a one-dimensional vector with an n×m rows and one column. The matrix H represents a transformation by which the components $f_1$, $f_2$, . . . , and $f_N$ of the vector f are subjected to encoding and intensity modulation with different pieces of encoding information for each wavelength band and added together. Accordingly, H is a matrix with n×m rows and n×m×N columns. The matrix H is herein sometimes referred to as "system matrix".

It now seems that once the vector g and the matrix H are given, f can be computed by solving an inverse problem of Formula (1). However, since the number of elements n×m×N of the data f to be obtained is larger than the number of elements n×m of the acquired data g, this problem is an ill-posed problem that cannot be directly solved. To address this problem, the signal processing circuit 200 of the present embodiment obtains the solution using a technique of compressed sensing through the use of redundancy of images contained in the data f. Specifically, the data f to be obtained is estimated by solving Formula (2) as follows:

$$f' = \underset{f}{\mathrm{argmin}}\{\|g - Hf\|_{l_2} + \tau\Phi(f)\} \quad (2)$$

In this formula, f' represents the data f thus estimated. The first term in parentheses of the above formula represents a difference between an estimated result Hf and the acquired data g, i.e. a so-called residual. Although the residual is a sum of squares here, the residual may for example be an absolute value or a square root of sum of squares. The second term in parentheses is the after-mentioned regularization term or stabilization term. Formula (2) means obtaining f that minimizes the sum of the first term and the second term. The signal processing circuit 200 can compute the final solution f' through convergence of solutions by a recursive iterative operation.

The first term in parentheses of Formula (2) means an operation of finding the sum of squares of the difference between the acquired data g and Hf obtained by a system transformation by the matrix H of f being estimated. $\Phi(f)$ of the second term is a constraint on the regularization of f, and is a function reflecting sparse information of the estimated data. $\Phi(f)$ functions to bring about an effect of smoothing or stabilizing the estimated data. The regularization term may be expressed, for example, by a discrete cosine transformation (DCT), a wavelet transformation, a Fourier transformation, or a total variation (TV) of f. For example, in a case where a total variation is used, stable estimated data can be acquired with a reduction in the effect of noise of the observed data g. The sparsity of the physical object 70 in a space of each regularization term varies depending on the texture of the physical object 70. It is possible to choose a regularization term having a space in which the texture of the physical object 70 becomes sparser. Alternatively, it is possible to incorporate a plurality of regularization terms into the operation. τ is a weighting factor. A greater weighting factor τ leads to an increase in reduction of redundant data, and by extension to a higher rate of compression. A smaller weighting factor τ leads to a weaker convergence to the solution. The weighting factor τ is set to such an appropriate value that f converges to some extent and does not become overcompressed.

Although, in this example operation, the compressed sensing shown in Formula (2) is used, another method may be used to obtain the solution. For example, another statistical method such as maximum likelihood estimation or a Bayesian estimation method may be used. Further, the number of separate images 220 is arbitrary, and each of the wavelength bands may be arbitrarily set. Details of the reconstruction method are disclosed in U.S. Patent Application Publication No. 2016/138975. The entire contents of the disclosure in U.S. Patent Application Publication No. 2016/138975 are hereby incorporated by reference.

Details of Configuration of Optical Filter Array

The following describes a specific example configuration of the filter array 10 that reduces errors in images to be reconstructed.

The following description assumes that each of the filters of the filter array 10 is a Fabry-Perot (FP) filter. The FP filter includes a first reflective layer, a second reflective layer, and an intermediate layer sandwiched between the first reflective layer and the second reflective layer. Each of the reflective layers may be formed from either a dielectric multi-layer film or a metal thin film. The intermediate layer has a thickness and a refractive index by which a resonant structure having at least one resonant mode is formed. The transmittance of light of a wavelength corresponding to the resonant mode is high, and the transmittance of light of another wavelength is low. Different transmission spectra can be achieved for each separate filter by varying the refractive index or thickness of the intermediate layer from one filter to another.

FIG. 9 is a diagram schematically showing a part of a cross-section of the photodetection device 300 according to the present embodiment. The photodetection device 300 includes the filter array 10 and the image sensor 60. The filter array 10 includes a plurality of filters 100 arranged in a two-dimensional array. The plurality of filters 100 are arranged in rows and columns. FIG. 9 schematically shows a cross-section structure of one row. Each of the plurality of filters 100 includes a resonant structure. The term "resonant structure" means a structure in which light of a certain wavelength stably exists with a standing wave formed inside. This state of light is referred to as "resonant mode". The resonant structure shown in FIG. 9 includes a first reflective layer 28a, a second reflective layer 28b, and an intermediate layer 26 sandwiched between the first reflective layer 28a and the second reflective layer 28b. The first reflective layer 28a and the second reflective layer 28b may each be formed from a dielectric multi-layer film or a metal thin film. The intermediate layer 26 may be formed from a dielectric or a semiconductor that is transparent in a particular wavelength region. The intermediate layer 26 may be formed, for example, from at least one selected from the group consisting of Si, $Si_3N_4$, $TiO_2$, $Nb_2O_5$, and $Ta_2O_5$. At least either the refractive indices or thicknesses of the intermediate layers 26 of the plurality of filters 100 vary from filter to filter. The transmission spectrum of each of the plurality of filters 100 in the example shown in FIG. 9 has local maximum values of transmittance at a plurality of wavelengths. The plurality of wavelengths correspond to a plurality of resonant modes with different orders in the aforementioned resonant structure. In the present embodiment, all of the filters 100 of the filter array 10 include such resonant structures. The filter array 10 may include a filter that does not have such a resonant structure. For example, the filter array 10 may include a filter, such as a transparent filter or an ND (neutral density filter), that does not have wavelength dependence of light transmittance.

The image sensor 60 includes a plurality of photodetection elements 60a. Each of the plurality of photodetection elements 60a is disposed to face one of the plurality of filters 100. Each of the plurality of photodetection elements 60a has sensitivity to light in a particular wavelength region. The particular wavelength region corresponds to the aforementioned target wavelength region W. The phrase "having sensitivity to light in a certain wavelength region" herein refers to having substantive sensitivity needed to detected light in the wavelength region. For example, the phrase refers to having an external quantum efficiency of 1% or higher in the wavelength region. The external quantum efficiency of a photodetection element 60a may be higher than or equal to 10%. The external quantum efficiency of a photodetection element 60a may be higher than or equal to 20%. All of the plurality of wavelengths at which the light transmittance of each of the filters 100 assumes local maximum values are included in the target wavelength region W.

A filter 100 including the aforementioned resonant structure is herein referred to as "Fabry-Perot filter". A portion of a transmission spectrum that has a local maximum value is herein referred to as "peak", and a wavelength at which a transmission spectrum has a local maximum value is herein referred to as "peak wavelength".

Let it be assumed in a filter 100 that L is the thickness of the intermediate layer 26, n is the refractive index of the intermediate layer 26, $\theta_i$ is the angle of incidence of light arriving at the filter 100, and m is the mode number of a resonant mode. m is an integer greater than or equal to 1. In this case, the peak wavelength $\lambda_m$ of the transmission spectrum of the filter 100 is expressed by Formula (3) as follows:

$$\lambda_m = \frac{2nL}{m}\sqrt{1-\left(\frac{\sin\theta_i}{n}\right)^2} \quad (3)$$

Let it be assumed that $\lambda_i$ and $\lambda_e$ are the shortest and longest wavelengths, respectively, in the target wavelength region W. A filter 100 in which there is one m that satisfies $\lambda_i \leq \lambda_m \leq \lambda_e$ is herein referred to as "single-mode filter". A filter 100 in which there are two or more m's that satisfy $\lambda_i \leq \lambda_m \leq \lambda_e$ is herein referred to as "multimode filter". The following describes an example of a case where the shortest and longest wavelengths $\lambda_i$ and $\lambda_e$ in the target wavelength region W are equal to 400 nm and 700 nm, respectively.

For example, in the case of a filter 100 in which the thickness L is equal to 300 nm, the refractive index n is equal to 1.0, and the vertical incidence $\theta_i$ is equal to 0 degree, the peak wavelength $\lambda_1$ at the time that m=1 is equal to 600 nm, and the peak wavelength $\lambda_{m\geq 2}$ at the time that m≥2 is shorter than or equal to 300 nm. Accordingly, this filter 100 is a single-mode filter having one peak wavelength in the target wavelength region W.

Meanwhile, when the thickness L is greater than 300 nm, a plurality of peak wavelengths are included in the target wavelength region W. For example, in the case of a filter 100 in which the thickness L is equal to 3000 nm, the refractive index n is equal to 1.0, and the vertical incidence $\theta_i$ is equal to 0 degree, the peak wavelength $\lambda_{1\leq m\leq 8}$ at the time that 1≤m≤8 is longer than or equal to 750 nm, the peak wavelength $\lambda_{9\leq m\leq 15}$ at the time that 9≤m≤15 is longer than or equal to 400 nm and shorter than or equal to 700 nm, and the peak wavelength $\lambda_{m\geq 16}$ at the time that m≥16 is shorter than or equal to 375 nm. Accordingly, this filter 100 is a multimode filter having seven peak wavelengths included in the target wavelength region W.

As noted above, a multimode filter can be achieved by appropriately designing the thickness of the intermediate layer 26 of a filter 100. Instead of the thickness of the intermediate layer 26, the refractive index of the intermediate layer 26 of the filter 100 may be appropriately designed. Alternatively, both the thickness and refractive index of the intermediate layer 26 of the filter 100 may be appropriately designed.

Figure 10:
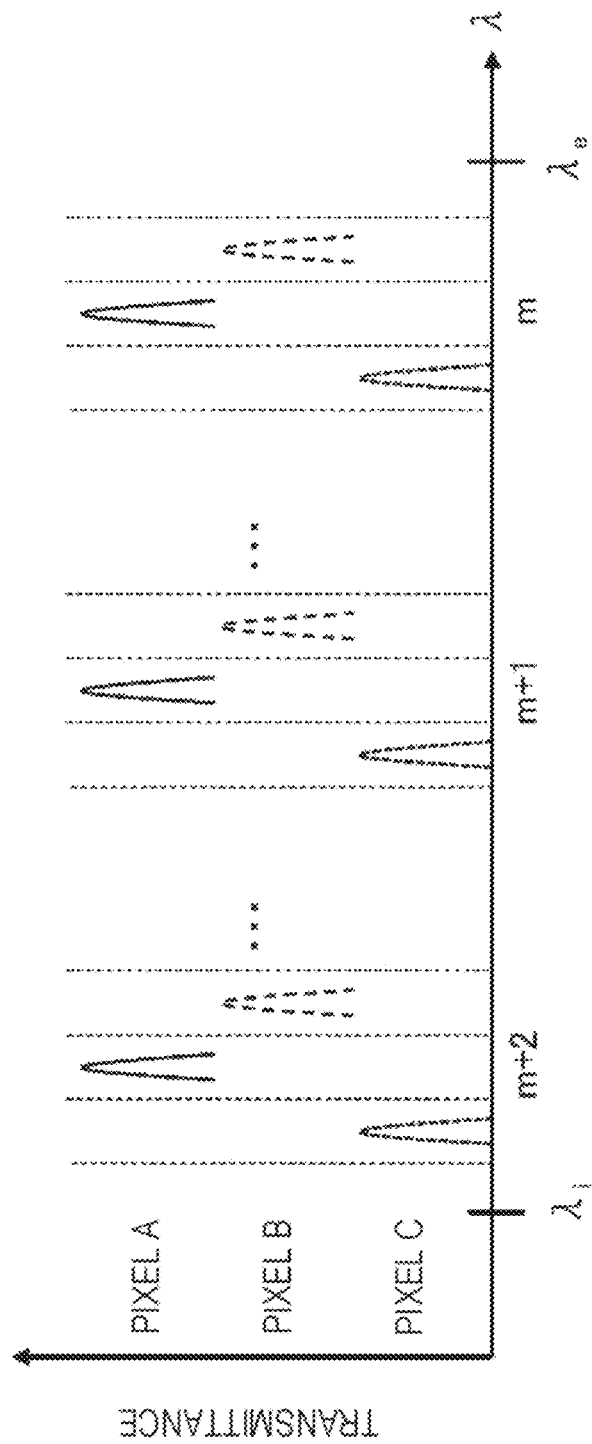
FIG. 10 is a diagram for explaining an example of the transmission spectrum of a filter.

FIG. 10 is a diagram schematically showing examples of transmission spectra in each separate pixel in a case where a plurality of multimode filters having transmission spectra differing from one another are disposed above a plurality of pixels serving as the plurality of photodetection elements 60a, respectively. FIG. 10 illustrates transmission spectra in pixels A, B, and C. The plurality of multimode filters are designed so that peak wavelengths vary slightly from pixel to pixel. Such a design can be achieved by slightly varying the thickness L and/or the refractive index n in Formula (3). In this case, in each of the pixels, a plurality of peaks appear in the target wavelength region W. The respective mode numbers of the plurality of peaks are the same in each of the pixels. The mode numbers of the plurality of peaks shown in FIG. 10 are m, m+1, and m+2. The photodetection device 300 according to the present embodiment can simultaneously detect light at a plurality of peak wavelengths varying from photodetection element 60a to photodetection element 60a, i.e. from pixel to pixel.

The following describes an example configuration in which the first reflective layer 28a and the second reflective layer 28b are each formed from a dielectric multi-layer film.

Figure 11:
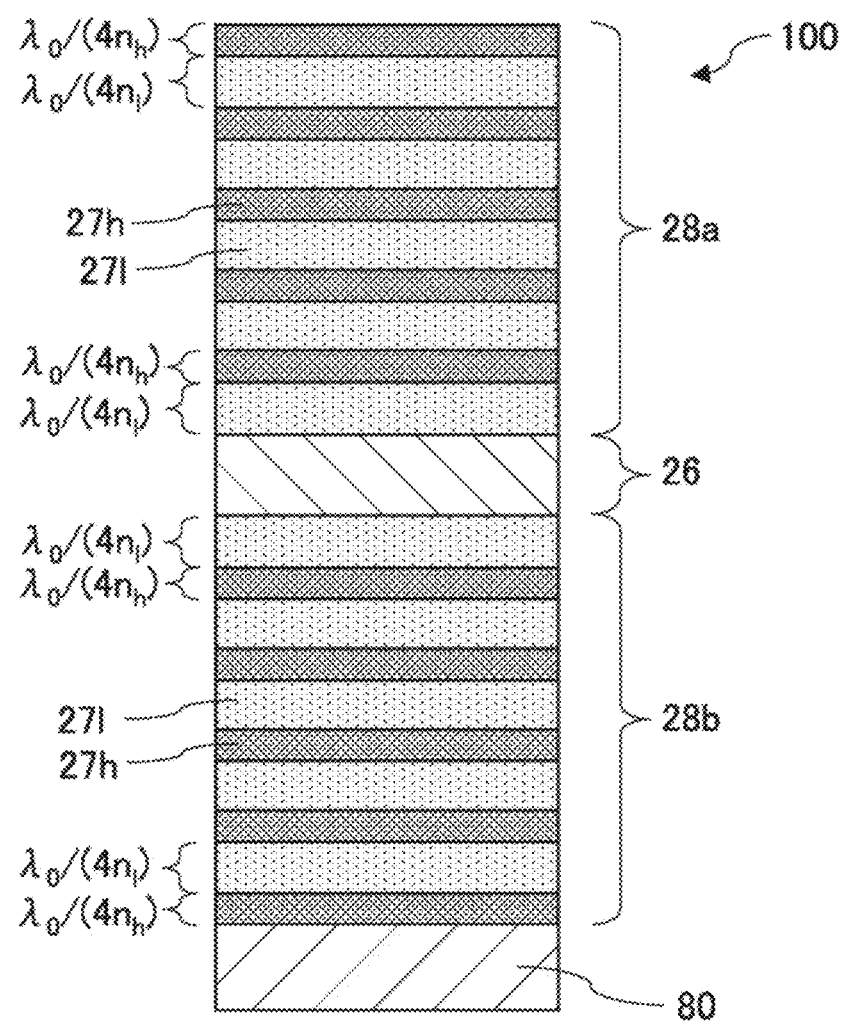
FIG. 11 is a diagram schematically showing an example of a Fabry-Perot filter.

FIG. 11 is a diagram schematically showing an example of a filter 100 whose reflective layers are each formed from a dielectric multi-layer film. The filter 100 is provided on a substrate 80. The first reflective layer 28a and the second reflective layer 28b are each formed from a dielectric multi-layer film. That is, the first reflective layer 28a and the second reflective layer 28b each include a structure in which a plurality of low-refractive-index layers 27l and a plurality of high-refractive-index layers 27h alternate. Each of the plurality of low-refractive-index layer 27l has a refractive index $n_l$, and each of the plurality of high-refractive-index layers 27h has a refractive index $n_h$ that is higher than the refractive index $n_l$. The low-refractive-index layers 27l in the first reflective layer 28a and the low-refractive-index layers 27l in the second reflective layer 28b may have the same refractive index or may have different refractive indices. The high-refractive-index layers 27h in the first reflective layer 28a and the high-refractive-index layers 27h in the second reflective layer 28b may have the same refractive index or may have different refractive indices.

A dielectric multi-layer film includes a plurality of pair layers. One pair layer includes one low-refractive-index layer 27l and one high-refractive-index layer 27h. In the example shown in FIG. 11, the first reflective layer 28a and the second reflective layer 28b each include five pair layers including ten refractive index layers. In the example shown in FIG. 11, a high reflectance is attained at a particular wavelength Xo within the target wavelength region W by setting the thicknesses of the high-refractive-index layers 27h to $t_h=\lambda_0/(4n_h)$ and setting the thicknesses of the low-refractive-index layers 27l to $t_l=\lambda_0/(4n_l)$. In other words, the optical lengths of the thicknesses $t_h$ of the high-refractive-index layers 27h and the optical lengths of the thicknesses $t_l$ of the low-refractive-index layers 27l are $\lambda_0/4$. The term "optical length" here means a value obtained by multiplying a thickness by a refractive index. The particular wavelength $\lambda_O$ may be set, for example, to a center wavelength $(\lambda_i+\lambda_e)/2$ in the target wavelength region W.

Figure 12:
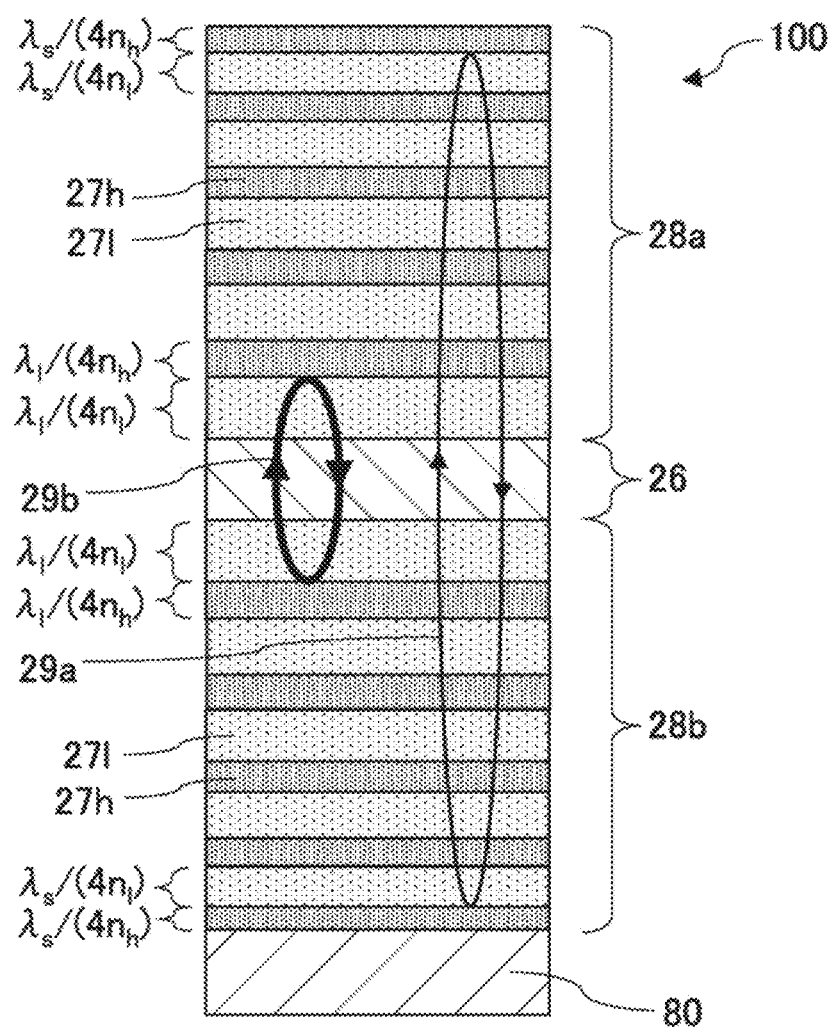
FIG. 12 is a diagram schematically showing another example of a Fabry-Perot filter.

FIG. 12 is a diagram schematically showing another example of a filter 100 whose reflective layers are each formed from a dielectric multi-layer film. In the example shown in FIG. 12, unlike in the example shown in FIG. 11, the thicknesses of the plurality of high-refractive-index layers 27h and the thicknesses of the plurality of low-refractive-index layers 27l are not uniform in each of the first and second reflective layers 28a and 28b. That is, in each of the first and second reflective layers 28a and 28b, at least two of the low-refractive-index layers 27l have thicknesses differing from each other, and at least two of the high-refractive-index layers 27h have thicknesses differing from each other. In each of the first and second reflective layers 28a and 28b, the optical length of each of the plurality of low-refractive-index layers 27l is equal to the optical length of a high-refractive-index layer 27h adjacent to that low-refractive-index layer 27l. The dielectric multi-layer film shown in FIG. 12 may be designed to reflect light in a wavelength region ranging from a wavelength $\lambda_s$ to a wavelength $\lambda_l$. The wavelength $\lambda_s$ may be identical to or different from the aforementioned wavelength $\lambda_i$. Similarly, the wavelength $\lambda_l$ may be identical to or different from the aforementioned wavelength $\lambda_e$. When, in each of the first and second reflective layers 28a and 28b, the plurality of pair layers are numbered, for example, from n=0 to n=3 in order of decreasing distance from the intermediate layer 26, the thicknesses of the high-refractive-index layers 27h are given as $t_h(n)=[\lambda_s+n(\lambda_l-\lambda_s)/3]/(4n_h)$, and the thicknesses of the low-refractive-index layers 27l are given as $t_l(n)=[\lambda_s+n(\lambda_l-\lambda_s)/3]/(4n_l)$. Thus, in each of the first and second reflective layers 28a and 28b, the thicknesses $t_h(n)$ of the high-refractive-index layers 27h and the thicknesses $t_l(n)$ of the low-refractive-index layers 27l are both linearly modulated from $\lambda_s/4$ to $\lambda_l/4$. For example, assuming that the wavelength $\lambda_s$ is equal to 350 nm and the wavelength $\lambda_l$ is equal to 700 nm, the optical lengths of the thicknesses of each of the pair layers linearly vary from $\lambda_s/4=87.5$ nm to $\lambda_l/4=175$ nm.

In the example shown in FIG. 12, a first loop 29a indicated by a thin line and a second loop 29b indicated by a thick line represent light of the wavelength $\lambda_s$ and light of the wavelength $\lambda_l$ that are confined in the filter 100, respectively. The light of the wavelength $\lambda_s$ is reflected by a pair layer in the first reflective layer 28a that faces the plane of incidence and a pair layer in the second reflective layer 28b that faces the substrate 80. The light of the wavelength $\lambda_l$ is reflected by a pair layer in the first reflective layer 28a that faces the intermediate layer 26 and a pair layer in the second reflective layer 28b that faces the intermediate layer 26. In this way, the incident light is reflected by pair layers that correspond to the wavelength of the incident light. This reduces nonuniformity in reflectance in the target wavelength region W in the dielectric multi-layer film. The structure shown in FIG. 12 makes it possible to achieve a transmission spectrum such as that shown in FIG. 2.

Example Configuration of Optical Filter Array for Reducing Restoration Errors

The following describes an example configuration of the filter array 10 for reducing restoration errors.

First, effects that are brought about in a case where a filter array 10 composed of a plurality of FP filters is used in a hyperspectral camera that performs restoration processing by compressed sensing are described.

Figure 13:
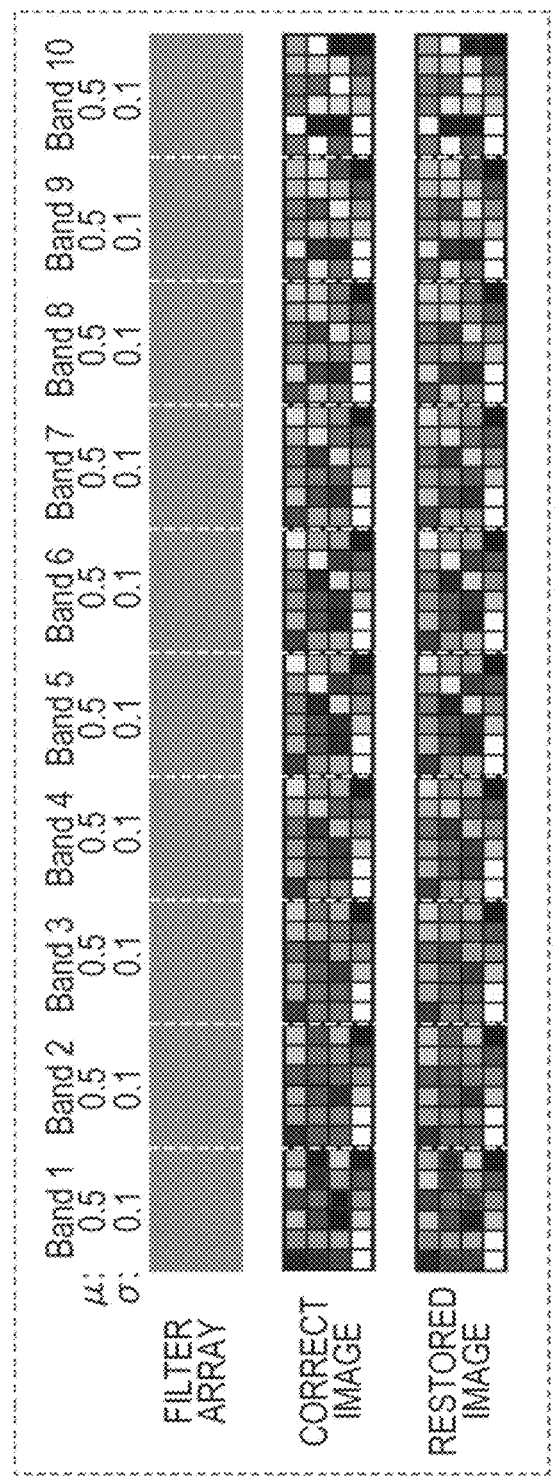
FIG. 13 is a diagram for explaining restoring characteristics attained by using an ideal filter array having about equal transmission characteristics for all wavelength bands.
Figure 14:
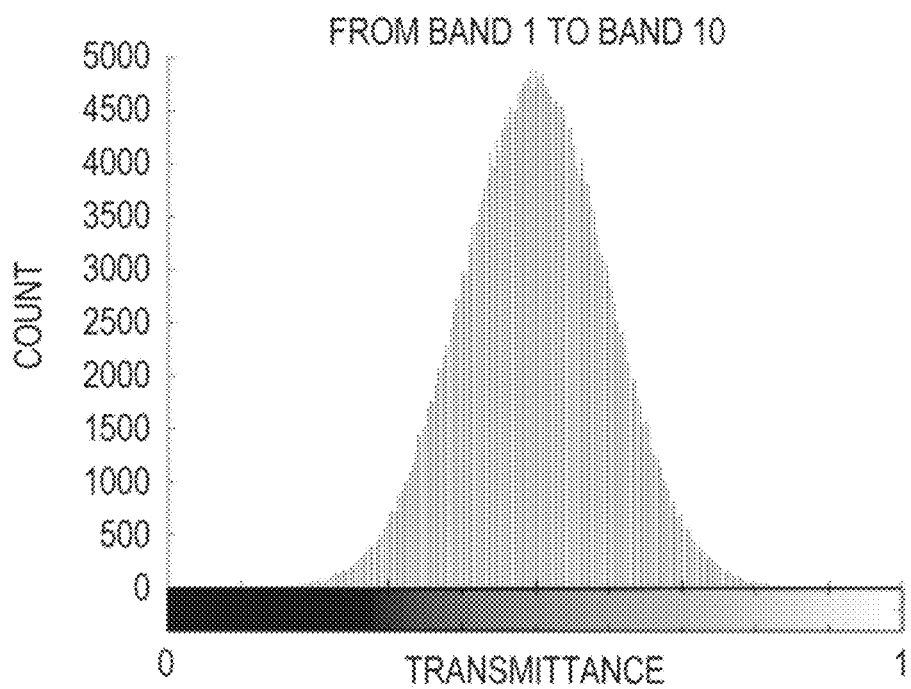
FIG. 14 is a diagram showing a histogram of the transmittance distribution of the filter array for each wavelength band in the example shown in FIG. 13.

FIG. 13 is a diagram for explaining restoring characteristics attained by using an ideal filter array 10 having about equal transmission characteristics of the filter array 10 for all wavelength bands. The ideal filter array 10 serves as a target of comparison in the following discussions. The example shown in FIG. 13 assumes ten wavelength bands 1 to 10. The transmittance distribution of each of the bands is given by a random number ranging from 0.0 to 1.0 in conformance with a normal distribution with an average transmittance of 0.5 and a standard deviation of 0.1. FIG. 14 shows a histogram of the transmittance distribution of the filter array 10 for each of the wavelength bands 1 to 10. In this example, a color chart including twenty-four color samples arranged in a matrix serves as a subject. The lower section of FIG. 13 shows examples of images separately for each of wavelength bands as restored by performing the aforementioned compressed sensing process on images acquired by the hyperspectral camera. The middle section of FIG. 13 shows correct images. In this example, a 640×480 two-dimensional filter array 10 is used. Further, an image sensor 60 that expresses pixel values with a number of tones of 8 bits (i.e. ranging from 0 to 256) is used. The histogram of transmittance is obtained from the values of transmittances converted from the pixel values of the pixels of the image sensor 60.

Figure 15:
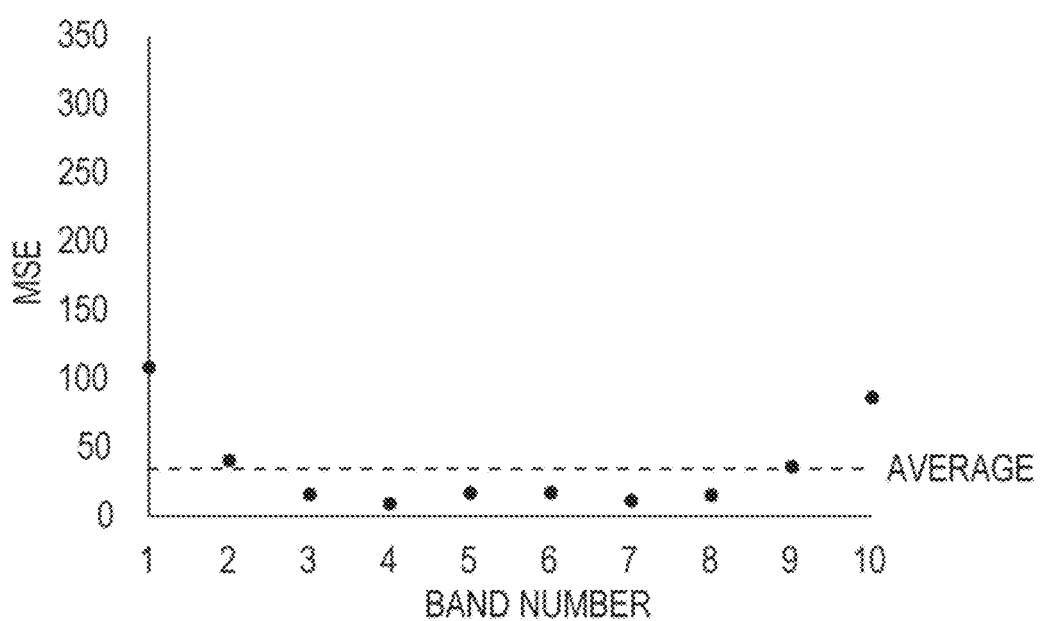
FIG. 15 is a diagram showing an error between a correct image and a restored image for each band in the example shown in FIG. 13.

FIG. 15 is a diagram showing an error between a correct image and a restored image for each band. In this example, the error used is a mean square error (MSE). The MSE is calculated according to Formula (4) as follows:

$$MSE = \frac{1}{n \cdot m} \sum_{i=1}^{n} \sum_{j=1}^{m} (I'_{i,j} - I_{i,j})^2 \qquad (4)$$

In this formula, n and m represent the numbers of pixels in a longitudinal direction and a transverse direction, respectively. $I_{i,j}$ represents the pixel value of the correct image in a pixel at a position (i, j). $I'_{i,j}$ represents the pixel value of an image in each wavelength band reconstructed in the pixel at the position (i, j).

In this example, the transmission characteristics of the filter array 10 are uniform across all bands; therefore, as shown in FIG. 15, the MSE can be kept down for any band. The average of MSEs in all bands was 35.6. This value is approximately 5.97 in terms of the pixel value of the image sensor 60, and is equivalent to an error of approximately 2.3% with respect to the maximum pixel value of 255. Thus, in a case where the average and standard deviation of the transmittance of the filter array 10 for each band are uniform, an image in each wavelength band can be restored with high accuracy.

Figure 16:
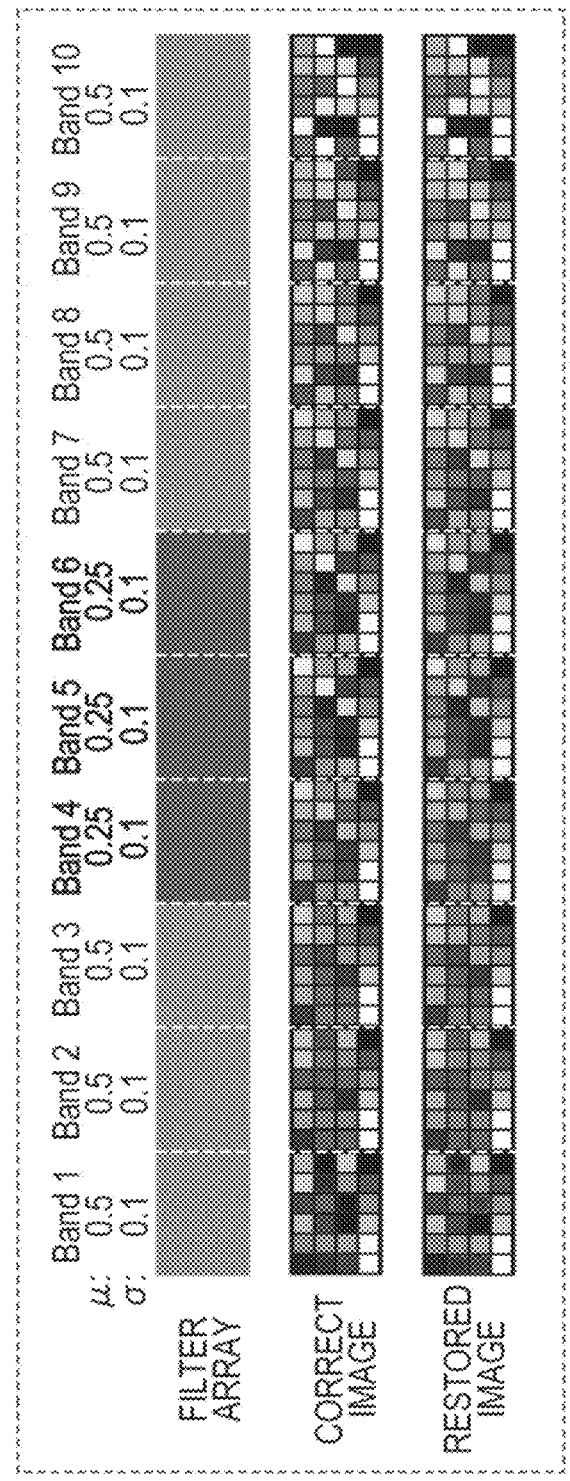
FIG. 16 is a diagram for explaining restoring characteristics attained in a case where the average transmittances of the filter array in some bands are low.
Figure 17:
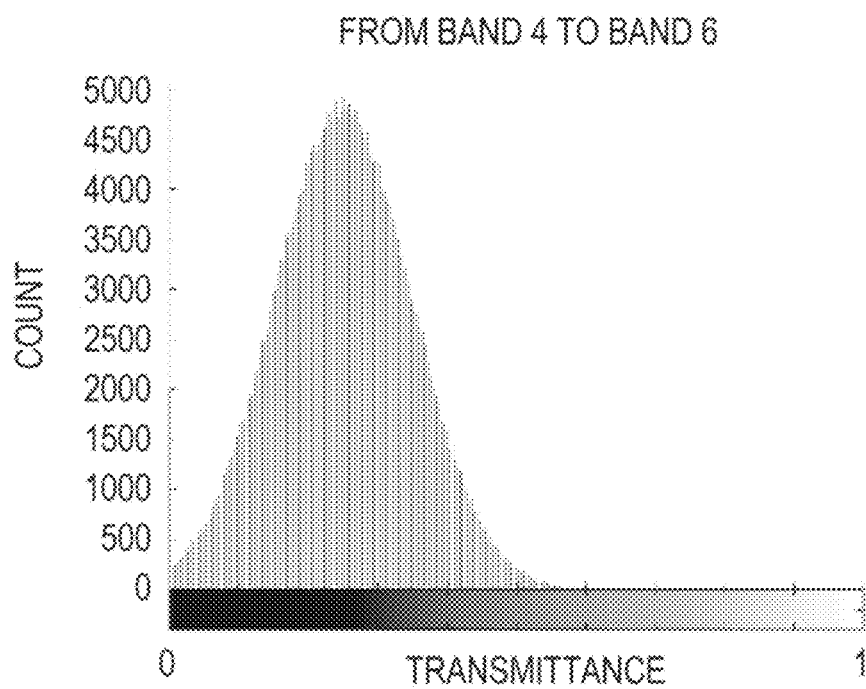
FIG. 17 is a diagram showing a histogram of the transmittances of the filter array for bands 4, 5, and 6 in the example shown in FIG. 16.
Figure 18:
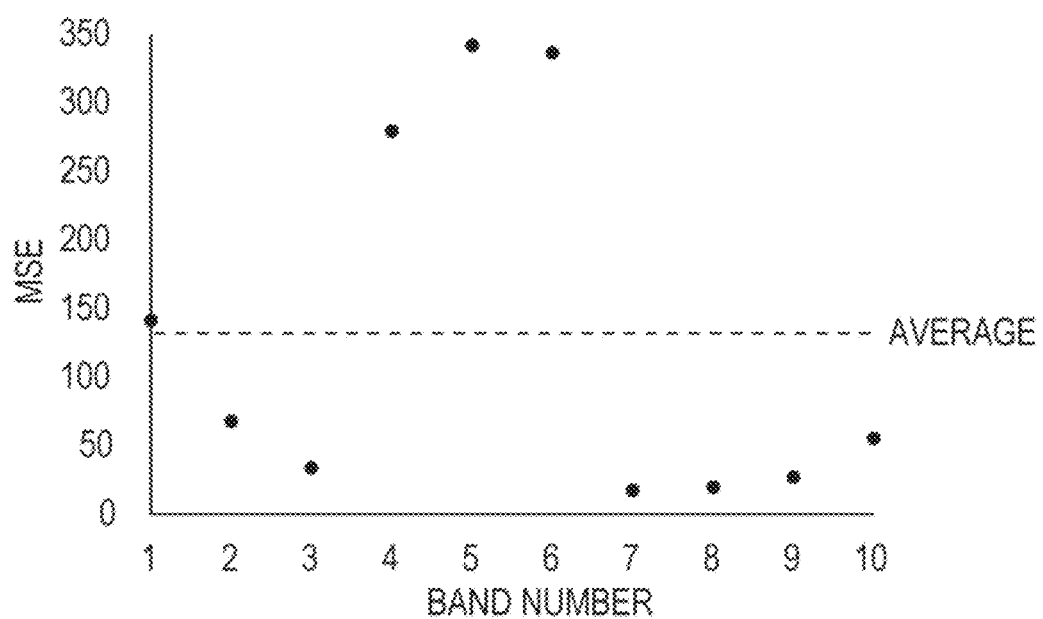
FIG. 18 is a diagram showing an error between a correct image and a restored image for each band in the example shown in FIG. 16.

FIG. 16 is a diagram for explaining restoring characteristics attained in a case where the average transmittances of the filter array 10 in some bands are low. This example assumes a case where the average transmittances in bands 4, 5, and 6 are lowered from 0.5 to 0.25. FIG. 17 is a diagram showing a histogram of the transmittances of the filter array 10 for the bands 4, 5, and 6. The other bands are the same as those of the histogram shown in FIG. 14. FIG. 18 is a diagram showing an error between a correct image and a restored image for each band. When the characteristics (in this example, average transmittance) of the filter array 10 become non-uniform, the bands 4, 5, and 6 remarkably deteriorate in MSE as shown in FIG. 18, and under the influence of this deterioration, the other bands deteriorate in restoring characteristic, too. The average of MSEs in all bands was 132. This value is approximately 11.5 in terms of the pixel value of the image sensor 60, and is equivalent to an error of approximately 4.5% with respect to the maximum pixel value of 255. Although, in this example, the average transmittance in the bands 4 to 6 is lowered, the same trend can be observed in any other band. From this result, it is found that there is an increase in restoration errors due to variations in the average transmittance.

Figure 19:
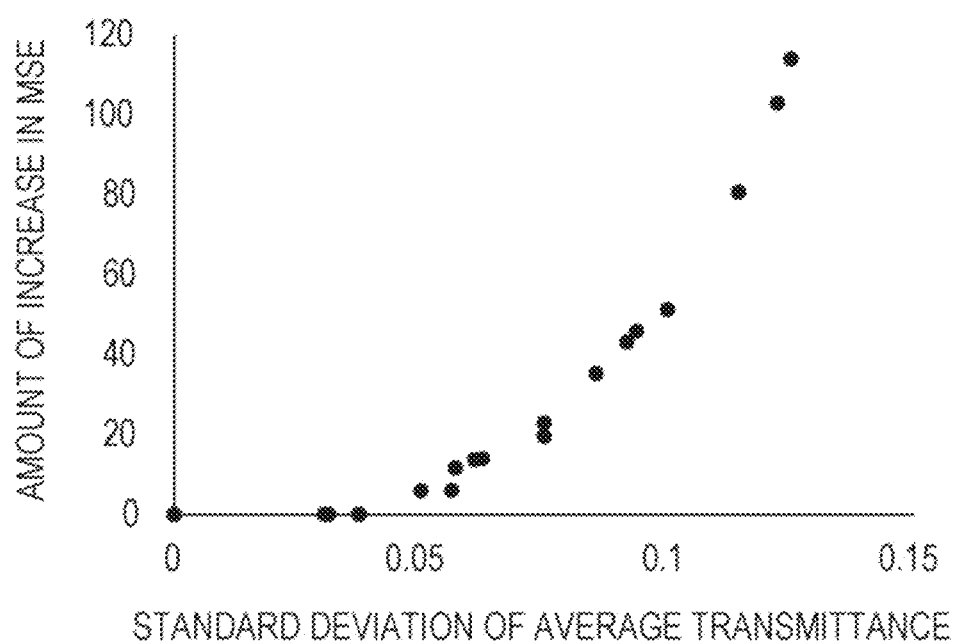
FIG. 19 is a diagram for explaining a deterioration in restoration due to an increase in the standard deviation of the average transmittance of the filter array.

FIG. 19 is a diagram for explaining an increase in MSE (i.e. a deterioration in restoration) due to an increase in the standard deviation (or variance) of the average transmittance of the filter array 10. In FIG. 19, the vertical axis represents the amount of increase from the MSE in the example shown in FIG. 13. As shown in FIG. 19, it is found that an increase in the standard deviation of the average transmittance entails an exponential increase in MSE.

Let it be assumed here that for light in an ith wavelength band (where i is an integer greater than or equal to 1 and less than or equal to N) of the N wavelength bands, $\mu_i$ is the average of the transmittances of a plurality of optical filters included in the filter array 10. Let it be also assumed that the filter array 10 includes M (where M is an integer greater than or equal to 4) filters and $T_{ij}$ is the transmittance of a jth (where j is an integer greater than or equal to 1 and less than or equal to M) filter of the M filters for the light in the ith wavelength band. Then, the average $\mu_i$ of the transmittances is expressed by Formula (5) as follows:

$$\mu_i = \frac{1}{M} \sum_{j=1}^{M} T_{ij} \qquad (5)$$

Assuming that a is the standard deviation of the average $\mu_i$ of the transmittances for the N wavelength bands, $\sigma_\mu$ is expressed by Formula (6) as follows:

$$\sigma_\mu = \sqrt{\frac{1}{N} \sum_{i=1}^{N} (\mu_i - \mu_\mu)^2}, \qquad (6)$$

$$\text{where } \mu_\mu = \frac{1}{N} \sum_{i=1}^{N} \mu_i$$

From the graph shown in FIG. 19, it is found that a filter array 10 with high reproducibility can be constructed by simply making the standard deviation $\alpha_\mu$ of the average transmittance less than or equal to a certain value. For example, the amount of increase in MSE can be kept less than or equal to approximately 100 by keeping the standard deviation $\sigma_\mu$ of the average transmittance less than or equal to 0.13. In a case where the standard deviation $\sigma_\mu$ of the average transmittance is kept less than or equal to 0.1, the amount of increase in MSE can be kept less than or equal to approximately 60. In a case where the standard deviation as of the average transmittance is kept less than or equal to 0.05, the amount of increase in MSE can be kept less than or equal to approximately 10.

Figure 20:
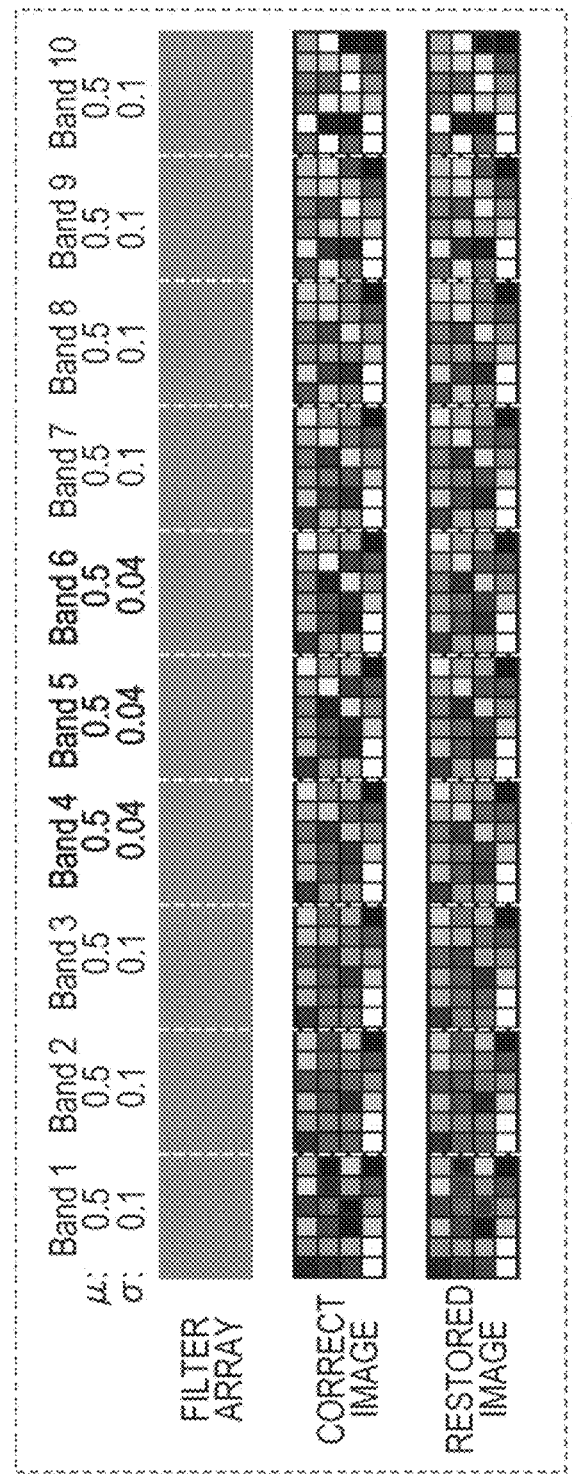
FIG. 20 is a diagram for explaining restoring characteristics attained in a case where the standard deviations of the transmittances of the filter array for some bands are small.
Figure 21:
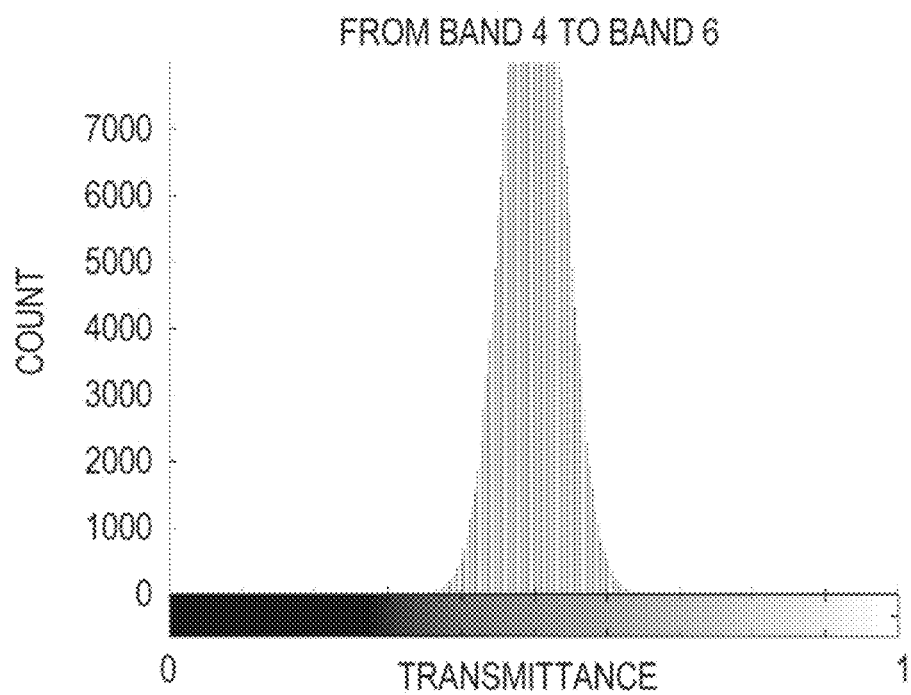
FIG. 21 is a diagram showing a histogram of the transmittances of the filter array for bands 4, 5, and 6 in the example show in FIG. 20.
Figure 22:
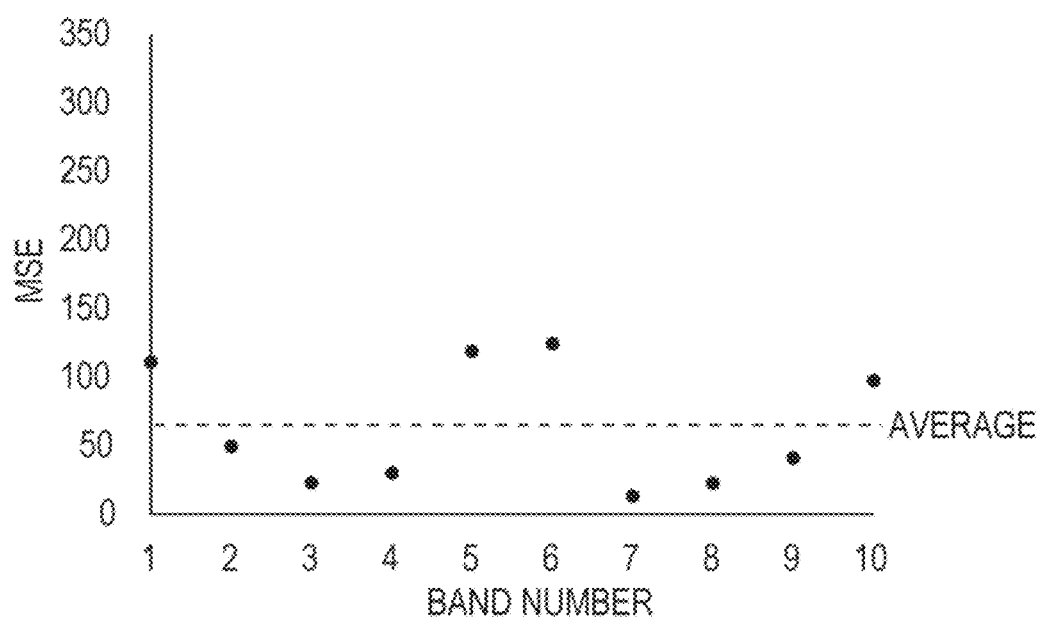
FIG. 22 is a diagram showing an error between a correct image and a restored image for each band in the example shown in FIG. 20.

FIG. 20 is a diagram for explaining restoring characteristics attained in a case where the standard deviations of the transmittances of the filter array 10 for some bands are small. This example assumes a case where the standard deviations in bands 4, 5, and 6 are lowered from 0.1 to 0.04. FIG. 21 is a diagram showing a histogram of the transmittances of the filter array 10 for the bands 4, 5, and 6. The other bands are the same as those of the histogram shown in FIG. 14. FIG. 22 is a diagram showing an error between a correct image and a restored image for each band. When the characteristics (in this example, a standard deviation of transmittances) of the filter array 10 become non-uniform, the other bands in addition to the bands 4, 5, and 6 deteriorate in restoring characteristic under the influence of this nonuniformity as shown in FIG. 22. In this example, the average of MSEs in all bands was 63.2. This value is approximately 7.95 in terms of the pixel value of the image sensor 60, and is equivalent to an error of approximately 3.1% with respect to the maximum pixel value of 255. Although, in this example, the average transmittances in the bands 4 to 6 are lowered, the same trend can be observed in any other band. From this result, it is found that there is an increase in restoration errors due to reductions or variations in the standard deviation of the transmittances.

Figure 23:
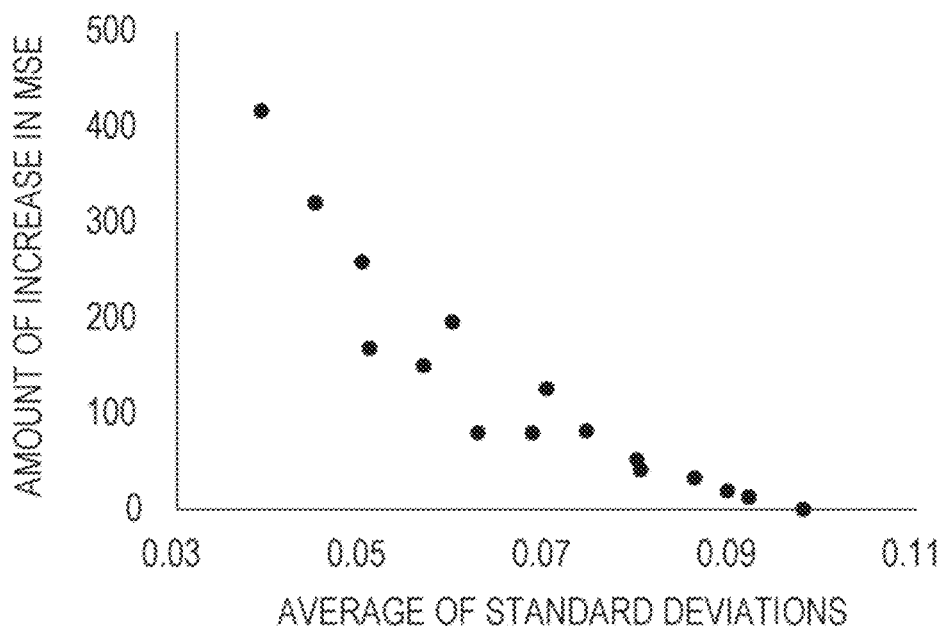
FIG. 23 is a diagram for explaining a deterioration in restoration due to a decrease in the average of standard deviations of the transmittances of the filter array.

FIG. 23 is a diagram for explaining an increase in MSE (i.e. a deterioration in restoration) due to a decrease in the average of standard deviations of the transmittances of the filter array 10. In FIG. 23, the vertical axis represents the amount of increase from the MSE in the example shown in FIG. 13. It is found that a reduction in the average of standard deviations of the transmittances leads to an exponential increase in MSE.

Let it be assumed here that for light in an ith wavelength band (where i is an integer greater than or equal to 1 and less than or equal to N) of the N wavelength bands, σl is the standard deviation of the transmittances of a plurality of optical filters included in the filter array 10. $\sigma_i$ is expressed by Formula (7) as follows:

$$\sigma_i = \sqrt{\frac{1}{M}\sum_{j=1}^{M}(T_{ij} - \mu_i)^2} \quad (7)$$

The average $\mu_\sigma$ of the standard deviations $\sigma_i$ of the transmittances for the N wavelength bands is expressed by Formula (8) as follows:

$$\mu_\sigma = \frac{1}{N}\sum_{i=1}^{N}\sigma_i \quad (8)$$

From the graph shown in FIG. 23, it is found that a filter array 10 with high reproducibility can be constructed by simply making the average $\mu_\sigma$ of the standard deviations $\sigma_i$ of the transmittances greater than or equal to a certain value. For example, in a case where the average $\mu_\sigma$ of the standard deviations $\sigma_i$ is made greater than or equal to 0.05, the amount of increase in MSE can be kept less than or equal to approximately 200. In a case where the average $\mu_\sigma$ of the standard deviations al is made greater than or equal to 0.07, the amount of increase in MSE can be kept less than or equal to approximately 100. In a case where the average $\mu_\sigma$ of the standard deviations a is made greater than or equal to 0.08, the amount of increase in MSE can be kept less than or equal to approximately 50.

Instead of carrying out an evaluation with the average $\mu_\sigma$ of the standard deviations $\sigma_i$, an evaluation may be carried out with another index value that indicates contrast (i.e. a dynamic range) for each band of the filter array 10. For example, the index value $R_i=(\mu_i+3\sigma_i)/(\mu_i-3\sigma_i)$, which takes the average transmittance into account, can be used.

Figure 24:
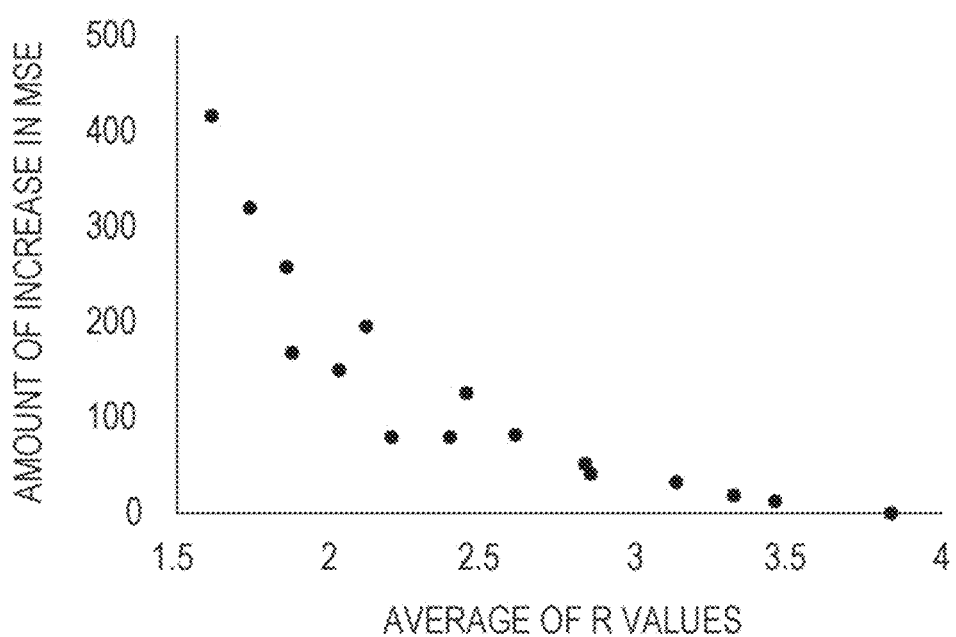
FIG. 24 is a graph showing a relationship between the average of index values $R_i$ for all bands and the amount of increase in MSE.

FIG. 24 is a graph plotted to show a relationship between the average of index values $R_i$ for all bands and the amount of increase in MSE. The trend of this graph is the same as that of FIG. 23.

The average $\mu_R$ of the index values $R_i$ for all bands is expressed by Formula (9) as follows:

$$\mu_R = \frac{1}{N}\sum_{i=1}^{N}R_i \quad (9)$$

From the graph shown in FIG. 24, it is found that a filter array 10 with high reproducibility can be constructed by simply making the average $\mu_R$ of $R_i$ greater than or equal to a certain value. For example, in a case where the average $\mu_R$ of $R_i$ is made greater than or equal to 2.0, the amount of increase in MSE can be kept less than or equal to approximately 200. In a case where the average $\mu_R$ of $R_i$ is made greater than or equal to 2.5, the amount of increase in MSE can be kept less than or equal to approximately 100. In a case where the average $\mu_R$ of $R_i$ is made greater than or equal to 3.0, the amount of increase in MSE can be kept less than or equal to approximately 50.

The optical nature of the filter array 10 in the foregoing discussions, i.e. the average transmittance and the standard deviation of the transmittances for each wavelength band, can be clarified by measuring and analyzing a histogram in any area including approximately six columns of pixels and approximately six rows of pixels. In a case where it is technically difficult to measure the transmission spectrum of such a filter array 10, it is possible to measure and analyze a histogram in a similar way by measuring a reflection spectrum for each wavelength band. Further, in a case where the filter array 10 is integrated on the image sensor 60, it is also possible to measure and analyze a histogram including the sensitivity characteristics of the image sensor 60 per se. Furthermore, in a case where each of the filters constituting the filter array 10 is an FP filter, there is in general a correlation between the thickness and histogram of a filter composed of a first reflective layer, a second reflective layer, and an intermediate layer disposed between the first reflective layer and the second reflective layer. For this reason, similar information can also be acquired by measuring a distribution of thicknesses in any area including approximately six columns of pixels and approximately six rows of pixels.

In a case where each of the filters constituting the filter array 10 is an FP filter, the transmittance tends to be higher in a wavelength band on a longer-wavelength side as described with reference to FIG. 2. Accordingly, in a filter array 10 composed of FP filters, a center wavelength λi in the ith wavelength band and the average μi of the transmittances of the plurality of optical filters for the light in the ith wavelength band often have a positive correlation. Although the foregoing embodiment has focused attention on a filter array 10 in which a plurality of filters are arranged in a two-dimensional array, the plurality of filters may be arranged in a one-dimensional array. In that case, a one-dimensional image sensor may be used as the photodetector. In a case where the target to be measured is a one-dimensional area, such a configuration may be employed, too.

A technology of the present disclosure is useful in a camera and a measuring instrument that acquire a multiwavelength image. The technology of the present disclosure is also applicable, for example, to biological, medical, and aesthetic sensing, food foreign material and residual pesticide testing systems, remote sensing systems, and on-board sensing systems.

What is claimed is:

1. An optical filter array that is used in a photodetection device generating image data separately for each of N wavelength bands, N being an integer greater than or equal to 4, the optical filter array comprising:
   a plurality of optical filters, wherein
   the plurality of optical filters include plural types of optical filters differing in transmittance from each other in each of the N wavelength bands,
   assuming that $\mu_i$ is an average of transmittances of the plurality of optical filters for light in an ith wavelength band of the N wavelength bands, i being an integer greater than or equal to 1 and less than or equal to N, a standard deviation $\sigma_\mu$ of the average $\mu_i$ of the transmittances for the N wavelength bands is expressed as $$\sigma_\mu = \sqrt{\frac{1}{N}\sum_{i=1}^{N}(\mu_i - \mu_\mu)^2},$$

$$\text{where } \mu_\mu = \frac{1}{N}\sum_{i=1}^{N}\mu_i,$$

and the standard deviation $\sigma_\mu$ of the average si of the transmittances is less than or equal to 0.13.

2. The optical filter array according to claim 1, wherein a transmittance of a peak in a histogram of the transmittances as obtained by measuring a transmittance of each of the plurality of optical filters for the light in the ith wavelength band with a photodetector that detects light intensity with a predetermined number of tones is smaller than the average $\mu_i$ of the transmittances of the plurality of optical filters for the light in the ith wavelength band.

3. The optical filter array according to claim 1, wherein at least one of the plurality of optical filters is a Fabry-Perot filter.

4. The optical filter array according to claim 1, wherein
at least one of the plurality of filters includes a first reflective layer, a second reflective layer, and an intermediate layer between the first reflective layer and the second reflective layer, and
the at least one of the plurality of filters includes a resonant structure having a plurality of resonant modes differing in order from each other.

5. The optical filter array according to claim 1, wherein a center wavelength $\lambda_i$ in the ith wavelength band and the average $\mu_i$ of the transmittances of the plurality of optical filters for the light in the ith wavelength band have a positive correlation.

6. An optical filter array that is used in a photodetection device generating image data separately for each of N wavelength bands, N being an integer greater than or equal to 4, the optical filter array comprising:
a plurality of optical filters, wherein
the plurality of optical filters include plural types of optical filters differing in transmittance from each other in each of the N wavelength bands, and
assuming that $\sigma_i$ is a standard deviation of transmittances of the plurality of optical filters for light in an ith wavelength band of the N wavelength bands, i being an integer greater than or equal to 1 and less than or equal to N, an average of standard deviations $\sigma_i$ of the transmittances for the N wavelength bands is greater than or equal to 0.07.

7. An optical filter array that is used in a photodetection device generating image data separately for each of N wavelength bands, N being an integer greater than or equal to 4, the optical filter array comprising:
a plurality of optical filters, wherein
the plurality of optical filters include plural types of optical filters differing in transmittance from each other in each of the N wavelength bands, and
assuming that $\mu_i$ is an average of transmittances of the plurality of optical filters for light in an ith wavelength band of the N wavelength bands, i being an integer greater than or equal to 1 and less than or equal to N, that $\sigma_i$ is a standard deviation of the transmittances of the plurality of optical filters for the light in the ith wavelength band, and that $R_i=(\mu_i+3\sigma_i)/(\mu_i-3\sigma_i)$, an average of $R_i$ for the N wavelength bands is greater than or equal to 2.0.

8. A photodetection device comprising:
the optical filter array according to claim 1; and
an image sensor that detects light having passed through the optical filter array.

9. A photodetection system comprising:
the photodetection device according to claim 8; and
a signal processing circuit that generates image data for each of the N wavelength bands in accordance with a signal outputted from the image sensor.

* * * * *